United States Patent
Sawai et al.

[11] Patent Number: 6,046,071
[45] Date of Patent: Apr. 4, 2000

[54] PLASTIC MOLDED SEMICONDUCTOR PACKAGE AND METHOD OF MANUFACTURING THE SAME

[75] Inventors: Akiyoshi Sawai; Haruo Shimamoto; Toru Tachikawa; Jun Shibata, all of Hyogo, Japan

[73] Assignee: Mitsubishi Denki Kabushiki Kaisha, Tokyo, Japan

[21] Appl. No.: 08/976,603

[22] Filed: Nov. 24, 1997

Related U.S. Application Data

[62] Division of application No. 08/456,335, Jun. 1, 1995, Pat. No. 5,710,062, which is a division of application No. 08/234,808, Apr. 28, 1994, Pat. No. 5,554,887.

[30] Foreign Application Priority Data

Jun. 1, 1993 [JP] Japan .................................. 5-130802

[51] Int. Cl.[7] .......................... H01L 21/44; H01L 21/48; H01L 21/50
[52] U.S. Cl. ........................... 438/106; 438/127; 438/613
[58] Field of Search .................. 438/127, 612, 438/613

[56] References Cited

U.S. PATENT DOCUMENTS

| | | |
|---|---|---|
| 3,625,837 | 12/1971 | Nelson et al. . |
| 3,959,874 | 6/1976 | Coucoulas . |
| 4,620,215 | 10/1986 | Lee . |
| 4,784,872 | 11/1988 | Moeller et al. . |
| 4,942,140 | 7/1990 | Ootsuki et al. . |
| 5,019,673 | 5/1991 | Juskey . |
| 5,120,678 | 6/1992 | Moore et al. . |
| 5,179,039 | 1/1993 | Ishida et al. . |
| 5,273,938 | 12/1993 | Lin et al. . |
| 5,302,553 | 4/1994 | Abbot et al. . |
| 5,504,035 | 4/1996 | Rostoker et al. . |
| 5,519,936 | 5/1996 | Andros et al. . |
| 5,554,887 | 9/1996 | Sawai et al. . |
| 5,565,379 | 10/1996 | Baba . |
| 5,567,656 | 10/1996 | Chun . |
| 5,710,062 | 1/1998 | Sawai et al. . |

FOREIGN PATENT DOCUMENTS

| | | |
|---|---|---|
| 53-141576 | 9/1978 | Japan . |
| 58-1100048 | 6/1983 | Japan . |
| 62-230027 | 10/1987 | Japan . |
| 1-161724 | 6/1989 | Japan . |
| 1-283948 | 11/1989 | Japan . |
| 2-49460 | 2/1990 | Japan . |
| 2-125633 | 5/1990 | Japan . |
| 2-131348 | 10/1990 | Japan . |
| 94438 | 4/1991 | Japan . |
| 3-104141 | 5/1991 | Japan . |
| 3-154344 | 7/1991 | Japan . |
| 3-293740 | 12/1991 | Japan . |
| 4-207046 | 7/1992 | Japan . |
| 5-3183 | 1/1993 | Japan . |

*Primary Examiner*—John F. Niebling
*Assistant Examiner*—Josetta I. Jones
*Attorney, Agent, or Firm*—McDermott, Will & Emery

[57] ABSTRACT

A pad electrode is formed on a main surface of a semiconductor chip. A passivation film, which covers a surface portion of the pad electrode, is formed on the main surface of the semiconductor chip. An internal connection conductor is formed on a surface portion of the pad electrode. The semiconductor chip is covered with a molding resin which exposes only a top surface of the internal connection conductor. An external connection conductor is formed on a top surface of the internal connection conductor. The external connection conductor has a substantially flat top surface. Thereby, a plastic molded semiconductor package can be easily mounted on a printed board, and can have improved reliability after being joined on the printed board.

2 Claims, 22 Drawing Sheets

PLASTIC MOLDED SEMICONDUCTOR PACKAGE AND METHOD OF MANUFACTURING THE SAME

This application is a division of application Ser. No. 08/456,335 filed Jun. 1, 1995, now U.S. Pat. No. 5,710,062 which is a division of application Ser. No. 08/234,808 filed Apr. 28, 1994 now U.S. Pat. No. 5,554,887.

BACKGROUND OF THE INVENTION

1. Field of the Invention

The present invention relates to a plastic molded semiconductor package and a method of manufacturing the same, and in particular, relates to a structure of a CSP (Chip Scale Package) and a method of manufacturing the same.

2. Description of the Related Art

In recent years, a demand for high-density mounting of packages in semiconductor devices has been increased. In accordance with this, the reduction of package size has been demanded. Various technologies, therefore, have been developed for reducing the size of packages. An example of the technology for reducing the package size is disclosed in Japanese Patent Laying-Open No. 2-49460 (1990). A plastic molded semiconductor package disclosed in this Japanese Patent Laying-Open No. 2-49460 will be described below.

FIG. 44 is a cross section showing the plastic molded semiconductor package disclosed in the Japanese Patent Laying-Open No. 2-49460. Referring to FIG. 44, a semiconductor chip 101 is provided at its main surface with pad electrodes 102, each of which functions as a part of an electrode for external extension (i.e., an electrode for external connection). A passivation film 103, which partially exposes a surface of each pad electrode 102, is formed on the main surface of the semiconductor chip 101. In this specification, the electrode for extension (i.e., electrode for external connection) is defined as an electrode used for electrical connection between elements in the semiconductor chip 101 and an electrode of an external equipment.

The pad electrode 102 is provided at its surface portion with a protruded electrode 104. The semiconductor chip 101 is molded with a molding resin 105, which partially exposes a surface of each protruded electrode 104.

Owing to the above structures, the plastic molded semiconductor package 100 can have the size nearly equal to those of the semiconductor chip 101. In other words, the sizes of plastic molded semiconductor package can be reduced. Consequently, the plastic molded semiconductor package suitable to high-density mounting can be obtained.

Following contents have been disclosed as a method of manufacturing the plastic molded semiconductor package 100 having the above structures. The protruded electrode 104 is formed by a well-known thick-film printing method. The resin encapsulation is carried out by a potting method or a transfer mold method.

The plastic molded semiconductor package 100 thus constructed, however, suffers from following problems, which will be described below with reference to FIGS. 45 to 50.

Referring to FIG. 45, a first problem of the conventional plastic molded semiconductor package 100 will be described below. FIG. 45 is a fragmentary enlarged cross section showing the first problem of the conventional plastic molded semiconductor package 100.

The protruded electrode 104 and the molding resin 105 are made of different materials, and thus have different coefficients of thermal expansion. Referring to FIG. 45, the protruded electrode 104 and the molding resin 105 are in contact with each other through a short length L and hence through a relatively small area. Therefore, when heat is applied to the protruded electrode 104, for example, in an operation for joining the plastic molded semiconductor package 100 on a printed board, the interfaces of the molding resin 105 and protruded electrode 104 are liable to delaminate due to expansion of the protruded electrode 104.

As a result, as shown in FIG. 45, a space 106 is liable to generate between the interfaces of the protruded electrode 104 and seal resin 105. This results in a problem that moisture resistance of the plastic molded semiconductor package 100 is deteriorated.

Referring to FIG. 46, a second problem of the conventional plastic molded semiconductor package 100 will be described below. FIG. 46 is a cross section showing an operation for mounting the conventional plastic molded semiconductor package 100 on a printed board 107.

Referring to FIG. 46, the printed board 107 is provided at its surface with electrodes 108 for electrical connection with the protruded electrodes 104. Each electrode 108 is provided at its surface with a joining member such as soldering paste for joining the electrode 108 and protruded electrode 104 together.

In the conventional plastic molded semiconductor package 100, a portion of the protruded electrode 104 located in the molding resin 105 has a diameter substantially equal to that of a portion thereof protruded externally from the seal resin 105. Thus, the portion of the protruded electrode 104 protruded from the seal resin 105 has a relatively small surface area.

This results in a problem that only a small margin is ensured for the positioning of the printed board 107 and plastic molded semiconductor package 100 when mounting the package 100 on the printed board 107. Also, the protruded electrode 104 is liable to fall from the surface of the electrode 108 on the printed board 107 when mounting the package 100 on the printed board 107, resulting in joining failure.

Referring to FIGS. 47 and 48, a third problem of the conventional plastic molded semiconductor package 100 will be described below. FIG. 47 is a cross section showing the plastic molded semiconductor package 100 suffering from the third problem. FIG. 48 is a plan showing an operation for mounting the plastic molded semiconductor packages 100 shown in FIG. 47 on the printed board 107.

Referring first to FIG. 47, it is difficult to hold the semiconductor chip 101 at a predetermined position during the resin encapsulation in a conventional method of manufacturing the plastic molded semiconductor package 100. No prior art has disclosed a method for holding the semiconductor chip 101 at the predetermined position. Therefore, the semiconductor chip 101 is deviated from the predetermined position in the molding resin 105 in some cases as shown in FIG. 47.

Therefore, the protruded electrodes 104 are protruded at positions deviated from the surface of the molding resin 105. More specifically, one of the protruded electrodes 104 is spaced by a distance L2 from the side of the package 100, while the other protruded electrode 104 is spaced from the side of the package 100 by a distance L1 longer than the distance L2 in some cases.

This results in a problem that the electrodes cannot be uniformly positioned in the plastic molded semiconductor package, and thus alignment in the mounting operation is difficult. Even if the plastic molded semiconductor package 100 is mounted on the printed board, a following problem may generate.

Referring to FIG. 48, four plastic molded semiconductor packages 100a, 100b, 100c and 100d are mounted on the surface of the printed board 107. These four plastic molded semiconductor packages 100a, 100b, 100c and 100d are mounted at shifted positions on the printed board 107 because they are provided with the protruded electrodes 104 located at different positions. This is disadvantageous in view of the high-density mounting of the plastic molded semiconductor packages 100 on the printed board 107.

Referring to FIGS. 49A and 49B, a fourth problem of the conventional plastic molded semiconductor package 100 will be described below. FIG. 49A is a cross section showing the conventional plastic molded semiconductor package 100 suffering from the fourth problem. FIG. 49B is a fragmentary enlarged cross section showing a region A in FIG. 49A.

Referring to FIGS. 49A and 49B, a mold flash 105a of resin is liable to leave around the surface of the protruded electrode 104 not to be covered with the molding resin 105 according to the method of resin encapsulation of the conventional plastic molded semiconductor package 100. This is due to the fact that it is difficult to hold the protruded electrode 104 or semiconductor chip 101 so as to prevent the flow of resin into the vicinity of the tip end of protruded electrode 104 when encapsulating.

If the plastic molded semiconductor package 100 including the mold flash 105a around the protruded electrode 104 were mounted on the printed board, a following problem would generate. Thus, electrical connection failure may generate between the protruded electrode 104 and an electrode formed on the printed board.

Even if the electric connection is formed, a fillet (meniscus), which is formed of a joining member 109 for joining the electrode 104 to the electrode on the printed board, is not formed around the protruded electrode 104, because the mold flash 105a is formed around the protruded electrode 104. This results in a problem that a mechanical joining strength between the protruded electrode 104 and the printed board remarkably decreases.

Therefore, it may be desirable to remove the mold flash 105a by an appropriate method. Removal of the mold flash 105a, however, applies damage against the protruded electrode 104 and/or a portion around the same, so that the reliability is liable to be impaired.

Then, a fifth problem of the conventional plastic molded semiconductor package 100 will be described below. FIG. 50A is a cross section showing the conventional plastic molded semiconductor package 100 suffering from the fifth problem. FIG. 50B is a cross section showing an example of the structures in which the semiconductor chip 101 including protruded electrodes 104a and 104b of different heights is encapsulated with the molding resin 105.

Referring to FIG. 50A, the protruded electrode 104 is formed by the thick-film printing in the prior art. Therefore, there is deviation in the supply amounts of material for forming the protruded electrodes 104. If the protruded electrodes 104 of relatively large heights are to be formed, as is done in the prior art, the deviation in the supply amounts of material of the protruded electrodes 104 is reflected on the difference in the heights of the protruded electrodes 104. In the extreme case, one of the protruded electrodes 104a is protruded from the seal resin 105 through a height L3, while the other protruded electrode 104b is protruded from the surface of the seal resin through a height L4 longer than the height L3 as shown in FIG. 50A. This results in the difficulty in the mounting operation of the plastic molded semiconductor package on the printed board.

A following problem may also be caused by encapsulating the semiconductor chip 101 having the protruded electrodes 104a and 104b of different heights with the molding resin 105. In an example of resin encapsulation, a die 110 which has concavities 110a and 110b receiving the protruded electrodes 104a and 104b is used as shown in FIG. 50B, and the resin encapsulating operation is carried out while supporting the protruded electrodes 104a and 104b by this die 110.

However, the semiconductor chip 101 inclines in the molding resin 105 thus formed because the heights of protruded electrodes 104a and 104b from the pad electrodes 102 are different from each other. Therefore, a constant pitch may not be ensured between the protruded electrodes 104a and 104b on the surface of molding resin 105. More specifically, the protruded electrodes 104a and 104b are spaced out each other by a pitch L6 which is smaller than the proper pitch L5 between the protruded electrodes 104a and 104b as shown in FIG. 50A. This may result in difficulty in the operation mounting the plastic molded semiconductor package 100 on the printed board.

Further, due to the deviation in the exposed heights of the protruded electrodes 104 from the molding resin 105, the connection failure is liable to generate between the protruded electrodes 104 and the electrodes on the printed board.

In addition to the problems described above, a following problem may generate. Referring to FIG. 44, the protruded electrodes 104, which are used in the plastic molded semiconductor package 100 thus constructed, require a relatively large height. The protruded electrodes 104, however, are formed by the thick-film printing method or the like, so that it is difficult to form the high protruded electrodes 104 in view of productivity and other.

Therefore, the height of the protruded electrodes 104 cannot be increased sufficiently. Therefore, washing fluid cannot efficiently flows between the printed board and the plastic molded semiconductor package 100 mounted thereon in the washing step.

Further, the plastic molded semiconductor package 100 in the prior art is not provided with a heat radiator. Therefore, heat generated from the semiconductor chip 101 is liable to stay in the package.

SUMMARY OF THE INVENTION

The present invention has been developed for overcoming the above-noted problems, and has an object to provide a plastic molded semiconductor package and a method of manufacturing the same, in which delamination of interfaces of an electrode for external connection and a molding resin is prevented for increasing reliability.

Another object of the invention is to provide a plastic molded semiconductor package and a method of manufacturing the same, in which a surface area of a portion of an electrode for external connection protruded from a molding resin is increased, so that the plastic molded semiconductor package can be easily mounted on a printed board and reliability after the mounting and the joining can be improved.

Still another object of the invention is to provide a plastic molded semiconductor package and a method of manufacturing the same, in which positions of electrodes for external connection in respective plastic molded semiconductor packages are standardized for achieving easy mounting of the plastic molded semiconductor packages on the printed boards.

Yet another object of the invention is to provide a plastic molded semiconductor package and a method of manufacturing the same, in which formation of a mold flash of resin around an electrode for external connection is effectively prevented for increasing reliability of the plastic molded semiconductor package mounted and joined on a printed board.

Further another object of the invention is to provide a plastic molded semiconductor package and a method of manufacturing the same, in which heights of portions of electrodes for external connection protruded from a surface of a molding resin are maintained substantially at a constant value for ensuring high reliability of the plastic molded semiconductor package mounted on a printed board.

A further object of the invention is to provide a plastic molded semiconductor package and a method of manufacturing the same, in which heights of portions of electrodes for external connection protruded from a surface of a molding resin are increased for facilitating a washing step carried out after a mounting and joining operation of the plastic molded semiconductor package on a printed board.

A still further object of the invention is to provide a plastic molded semiconductor package having an improved heat radiating characteristic as well as a method of manufacturing the same.

A plastic molded semiconductor package according to an aspect of the invention includes a semiconductor chip having a main surface, a pad electrode formed on the main surface of the semiconductor chip and functioning as a part of an electrode for external connection, an internal connection conductor formed on the pad electrode, having a substantially flat top surface and functioning as a part of the electrode for external connection, a molding resin encapsulating the semiconductor chip and exposing only the top surface of the internal connection conductor, and an external connection conductor formed on the top surface of the internal connection conductor, having a substantially flat top surface and functioning as a part of the electrode for external connection.

According to the plastic molded semiconductor package of the above aspect of the invention, the external connection conductor has the substantially flat top surface. This enables that, in a mounting operation of the plastic molded semiconductor package on a printed board, an area of contact between the external connection conductor and an electrode formed on the printed board is larger than that in the prior art. Thereby, a mounting operation can be easily performed in a self-alignment manner.

In the case where the external connection conductor has the large flat top surface, the mechanical joining strength thereof to the electrode on the printed board can be increased. Further, in the case where the top surface of the external connection conductor has an area larger than that of the top surface of the internal connection conductor, positioning between the external connection conductor and the electrode on the printed board can be performed more easily than the prior art.

The internal connection conductor and external connection conductor are formed of different layers. Therefore, the area of a bottom surface of the external connection conductor can be larger than that of the top surface of the internal connection conductor. Thereby, the bottom surface of the external connection conductor can have a portion being in contact with the surface of the molding resin. This results in substantial increase of the area of contact between the electrode for external connection and the molding resin. Thereby, it is possible to effectively prevent delamination of interfaces of the electrode for external connection and the molding resin from each other.

A plastic molded semiconductor package of another aspect of the invention includes a semiconductor chip having a main surface, a pad electrode formed on the main surface of the semiconductor chip and functioning as a part of an electrode for external connection, an insulating passivation film formed on the main surface of the semiconductor chip and exposing a portion of a surface of the pad electrode, a conductor formed on a portion of the surface of the pad electrode and functioning as a part of the electrode for external connection, a metal column for heat radiation having a bottom surface being in contact with a surface of the insulating passivation film and provided for radiating heat generated in the semiconductor chip, and a molding resin encapsulating the semiconductor chip and exposing portions of surfaces of the conductor and the metal column for heat radiation on the main surface.

According to the plastic molded semiconductor package of the above aspect of the invention, the metal column for heat radiation is provided for radiating the heat generated in the semiconductor chip. The metal column for heat radiation has the bottom surface, which is in contact with the surface of the insulating passivation film formed on the main surface of the semiconductor chip, and is protruded externally from interior of the molding resin. Thereby, the heat generated in the semiconductor chip can be effectively radiated externally from the plastic molded semiconductor package.

According to a method of manufacturing a plastic molded semiconductor package of an aspect of the invention, an internal connection conductor material is first formed at a predetermined position on a metal foil. Then, a main surface of a semiconductor chip including a pad electrode formed on the main surface is laid on the metal foil, whereby the pad electrode is located on the internal connection conductor material. The internal connection conductor material and the pad electrode are joined together to form the internal connection conductor. The semiconductor chip is encapsulated with resin while holding the metal foil. The metal foil is selectively etched to form an external connection conductor on the internal connection conductor.

According to the method of manufacturing the plastic molded semiconductor package of the above aspect of the invention, the semiconductor chip is encapsulated with the resin while holding the metal foil to which the semiconductor chip has already been joined. Therefore, the semiconductor chip can be fixed by holding the metal foil. Thereby, the encapsulating with resin can be performed more reliably with high accuracy. Also, it is possible to suppress deviation of the position of the semiconductor chip in the molding resin. As a result, it is possible to suppress deviation of the position of the internal connection conductor in the molding resin. Thereby, the external connection conductor can be easily formed substantially at a design position in the package. Further, the position at which the external connection conductor is formed can be easily standardized.

The external connection conductor is formed by selectively etching the metal foil. Thereby, the external connection conductor can have various sizes and configurations. For example, a bottom area of the external connection conductor may be determined to be larger than an area of a top surface of the internal connection conductor, whereby each external connection conductor can be located substantially at a design position in a surface of the molding resin even if the position of the internal connection conductor is slightly deviated. As a result, the plastic molded semiconductor package can be easily mounted on a printed board.

Since the connection conductor is formed by the etching, a mold flash, e.g., of resin does not leave on its side surface in contrast to the prior art. Thereby, a good fillet (meniscus) made of a joining material is formed on the side surface of the external connection conductor. This can improve the reliability after the joining.

Since the external connection conductor is formed by etching the metal foil, each external connection conductor protrudes from the molding resin through a substantially constant height. Thereby, joining failure between the external connection conductor and the electrode on the printed board can be effectively prevented when mounting the plastic molded semiconductor package on the printed board.

According to a method of manufacturing a plastic molded semiconductor package of another aspect of the invention, an insulating sheet (insulating base material) provided with a penetration bump having ends, at least one of which is protruded from a surface of the insulating sheet, is prepared. One end of the penetration bump is joined to a pad electrode formed on a main surface of a semiconductor chip. The semiconductor chip is encapsulated with resin while holding the insulating sheet. The insulating sheet is cut at a predetermined portion to form an end surface of the insulating sheet which is substantially coplanar with a surface of the molding resin.

According to a method of manufacturing a plastic molded semiconductor package of another aspect of the invention, an insulating sheet having a penetration bump is used. The penetration bump functions as an electrode for external connection of the plastic molded semiconductor package. This penetration bump can be formed in a step different from a step for manufacturing the plastic molded semiconductor package. Thereby, productivity of the plastic molded semiconductor package itself is improved.

Further, the resin encapsulation is performed while holding the insulating sheet. Thereby, the resin encapsulation can be performed more reliably with high accuracy, similarly to the case where the molding resin is formed while holding the metal foil as described above.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Embodiments of the invention will be described below with reference to FIGS. 1–43.

(First Embodiment)

Figure 1:
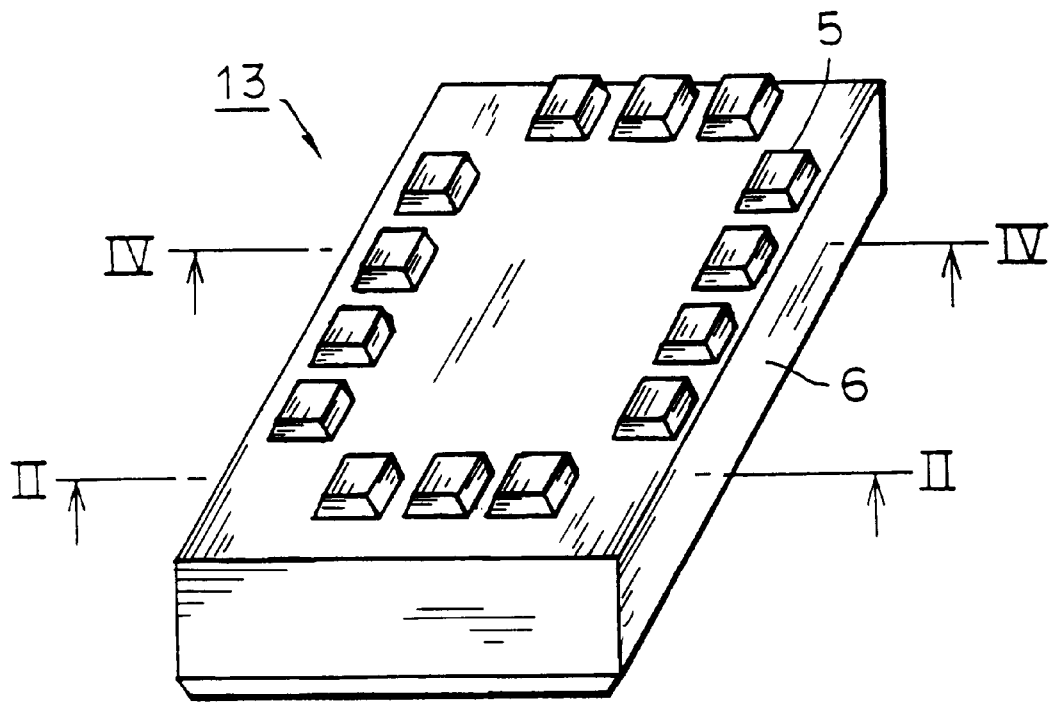
FIG. 1 is a perspective view showing a plastic molded semiconductor package of a first embodiment of the invention.
Figure 2:
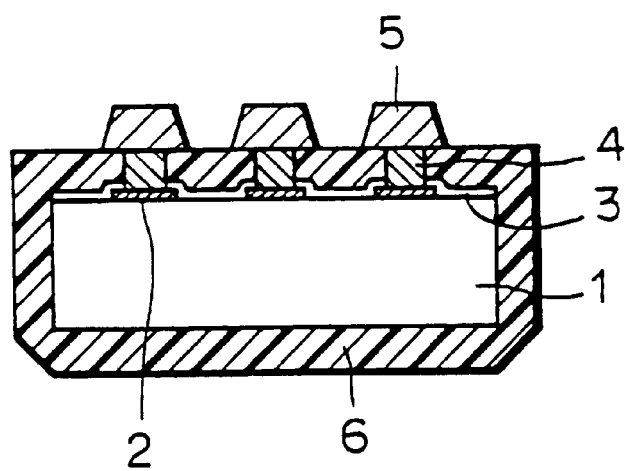
FIG. 2 is a cross section taken along line II—II in FIG. 1.
Figure 3:
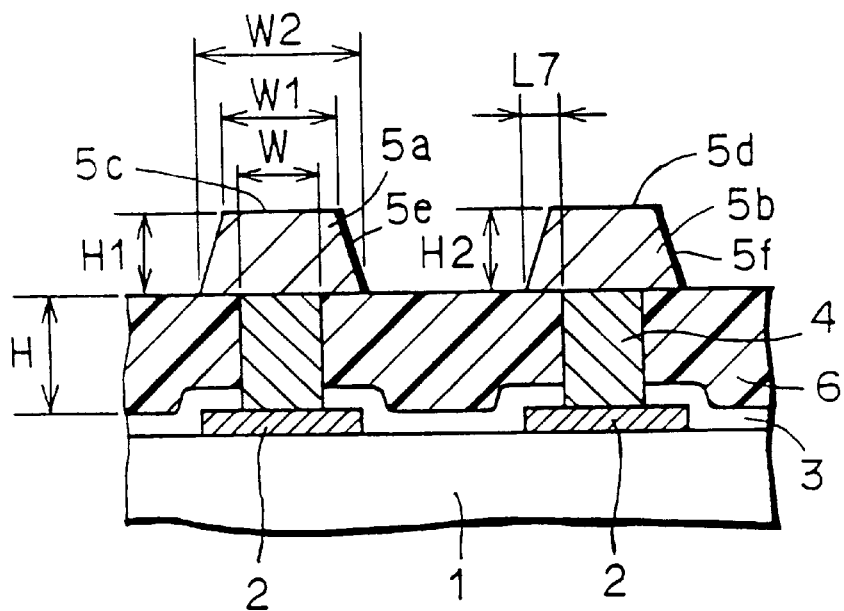
FIG. 3 is an enlarged cross section of an electrode part in FIG. 2.

Referring to FIGS. 1–6, a plastic molded semiconductor package of a first embodiment of the invention will now be described below in connection with its structures as well as distinctive operation and effect. Referring first to FIGS. 1–3, the structures of the plastic molded semiconductor package of the first embodiment of the invention will be described below. FIG. 1 is a perspective view showing the plastic molded semiconductor package of the first embodiment of the invention. FIG. 2 is a cross section taken along line II—II in FIG. 1. FIG. 3 is an enlarged fragmentary cross section showing an electrode part for external connection in FIG. 2.

Referring to FIG. 1, the plastic molded semiconductor package 13 of the first embodiment of the invention includes a plurality of external connection conductors 5 located in a main surface of a molding resin 6. When the plastic molded semiconductor package 13 is mounted on a printed board or the like, the external connection conductors 5 are electrically connected to electrodes formed on the printed board.

The form of each external connection conductor 5 shown in FIG. 1 is frustum of pyramid. The form of the external connection conductor 5, however, may be circular truncated cone, and the external conductor 5 is required only to have a form provided with a flat top surface.

Referring to FIG. 2, internal structures of the plastic molded semiconductor package 13 shown in FIG. 1 will be described below. Referring to FIG. 2, the semiconductor chip 1 is provided at its main surface with pad electrodes 2 each functioning as a part of an electrode for external connection. A passivation film 3 having openings, each of which is located over a portion of the surface of the corresponding pad electrode 2, is formed on the main surface of the semiconductor chip 1.

On the portion of the surface of each pad electrode 2, there is formed an internal connection conductor 4 which is electrically connected to the pad electrode 2. The internal connection conductor 4 has a substantially flat top surface. The semiconductor chip 1 is encapsulated with a molding resin 6, which exposes only the substantially flat top surfaces of the internal connection conductors 4.

The external connection conductors 5 are formed on the top surfaces of the internal connection conductors 4 and are electrically connected thereto, respectively. In this embodiment, the external connection conductor 5 has a substantially trapezoidal section, and also has a substantially flat top surface and a substantially flat bottom surface. A portion of the substantially flat bottom surface of the external connection conductor 5 is joined to the top surface of the internal connection conductor 4. The remaining portion of the bottom surface of the external connection conductor 5 is in contact with the surface of the molding resin 6.

Referring to FIG. 3, the structure of the electrode part for external connection in the plastic molded semiconductor package 13 shown in FIG. 2 will be described below more in detail. Referring to FIG. 3, first and second external connection conductors 5a and 5b are formed on the main surface of the molding resin 6. The first and second external connection conductors 5a and 5b have substantially flat top surfaces 5c and 5d, respectively.

It is preferable that an average plane width W1 of the top surfaces 5c and 5d of the first and second external connection conductors 5a and 5b is larger than a plane width W of the top surface of the internal connection conductor 4. This ensures relatively large areas of the top surfaces 5c and 5d of the first and second external connection conductors 5a and 5b, which can achieve following operation and effect.

The operation and effect will be described below with reference to FIGS. 4 and 5, which are cross sections showing different stages in which the plastic molded semiconductor package of the first embodiment of the invention is being mounted on a printed board 7. More specifically, the cross sections of the plastic molded semiconductor package in FIGS. 4 and 5 correspond to the cross section taken along line IV—IV in FIG. 1.

Figure 4:
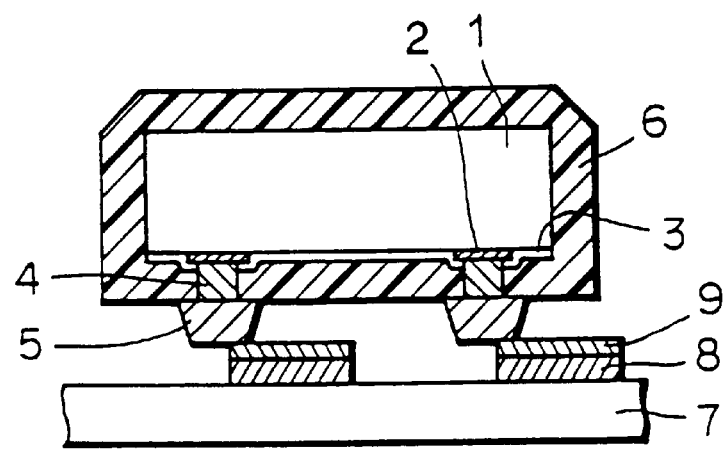
FIG. 4 is a cross section showing a state in which the plastic molded semiconductor package of the first embodiment of the invention is being mounted on a printed board.
Figure 5:
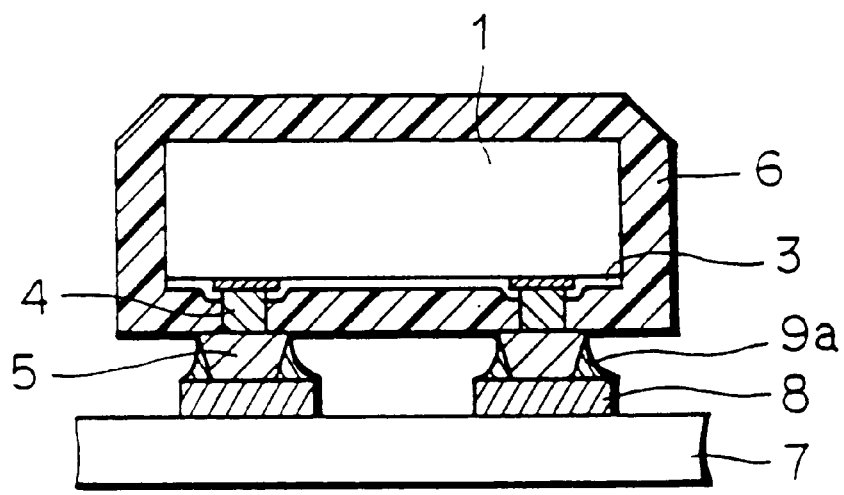
FIG. 5 is a cross section showing a state in which the plastic molded semiconductor package of the first embodiment of the invention is joined on the printed board.

Referring first to FIG. 4, electrodes 8 are formed at predetermined positions on the printed board 7. Joining material 9, e.g., made of solder paste are formed on surfaces of the electrodes 8. The joining material 9 join the external connection conductors 5 to the electrodes 8 on the printed board 7.

Since the external connection conductors 5 have the flat top surfaces 5c and 5d of relatively large areas, positioning thereof with respect to the electrodes 8 on the printed board 7 can be performed more easily than the prior art. Even if the position of the plastic molded semiconductor package is deviated with respect to the electrodes 8 to some extent as shown in FIG. 4, the top surfaces 5c and 5d of the external connection conductors 5 are located on the joining material 9. Heat treatment is effected on them, so that the external connection conductors 5 and the electrodes 8 are joined together in an self-aligned manner as shown in FIG. 5.

In the form shown in FIG. 3, it has been stated that a plane width W1 of each of the top surfaces 5c and 5d of the first and second external connection conductors 5a and 5b is preferably larger than the plane width W of the top surface of the internal connection conductor. However, the top surface width W1 of the external connection conductor 5 may be equal to or smaller than the top surface width W of the internal connection conductor.

It can be considered that mold flashes of resin or the like can be hardly formed on side surfaces 5e and 5f of the first and second external connection conductors 5a and 5b in contrast to the prior art. This can be achieved owing to the method of forming the first and second external connection conductors 5a and 5b, which will be described more in detail later.

Since there is almost no possibility that mold flashes, e.g., of resin are formed on the side surfaces 5e and 5f of the external connection conductors 5a and 5b as described above, fillets (meniscuses) formed of the joining material, which serve to join the electrodes 8 on the printed board 7 to the external connection conductors 5, are surely formed on the side surfaces 5e and 5f of the first and second external connection conductors 5a and 5b when the plastic molded semiconductor package is joined on the printed board 7. Thereby, the first and second external connection conductors 5a and 5b can be joined to the electrodes 8 on the printed board 7 more reliably than the prior art.

There is a distance of H1 between the top surface 5c of the first external connection conductor 5a and the main surface of the molding resin 6. Also, there is a distance of H2 between the top surface 5d of the second external connection conductor 5b and the main surface of the molding resin 6. These distances (heights) H2 and H1 are determined to be substantially equal to each other, and each of them are preferably about $18\mu$ to 200 $\mu$m.

Owing to the substantially equal heights H1 and H2 of the first and second external connection conductors 5a and 5b from the surface of the molding resin 6, the electrodes 8 formed on the printed board 7 can be joined more reliably to the first and second external connection conductors 5a and 5b when the package is mounted on the printed board 7.

Thereby, high reliability can be ensured after the joining to the printed board.

Further, the heights H1 and H2 of the first and second external connection conductors 5a and 5b from the surface of the molding resin 6 can be relatively large owing to the method of manufacturing the first and second external connection conductors 5a and 5b. More specifically, the first and second external connection conductors 5a and 5b are formed by etching metal foil. Therefore, by preparing thick metal foil, the heights H1 and H2 of the first and second external connection conductors 5a and 5b can be easily increased. This achieves following operation and effect.

A relatively large space can be ensured between the surface of the printed board 7 and the surface of the molding resin 6 of the plastic molded semiconductor package 13 joined on the printed board 7 owing to the relatively large heights H1 and H2 of the first and second external connection conductors 5a and 5b from the surface of the molding resin 6.

Generally, the first and second external connection conductors 5a and 5b are joined to the electrodes 8 formed on the printed board 7 by the joining material 9 of soldering paste or the like. Therefore, a cleaning step is required after the joining. In this cleaning step, cleaning fluid can efficiently flow owing to the large heights H1 and H2 of the first and second external connection conductors 5a and 5b, and thus the cleaning step can be performed easily.

It is preferable that each bottom plane width W2 of the first and second external connection conductors 5a and 5b is larger than the top plane width W of the internal connection conductor 4. This enables the first and second external connection conductors 5a and 5b to have bottom surface portions which are in contact with the surface of the molding resin 6.

In FIG. 3, each bottom surface of the first and second external connection conductors 5a and 5b is in contact with the surface of the molding resin 6 through a distance of L7. Owing to the contact of the first and second external connection conductors 5a and 5b with the surface of the molding resin 6, a distance which moisture or the like moves until it reaches the surface of the semiconductor chip 1 can be increased, compared with the prior art. Therefore, moisture resistance can be improved, compared with the prior art.

Since the bottom surfaces of the first and second external connection conductors 5a and 5b are in contact with the surface of the molding resin 6, the area of contact between the external connection conductors and the molding resin 6 can be correspondingly increased. Thereby, delamination of interfaces of the electrode for external connection conductor and molding resin 6 can be effectively prevented. As a result, the plastic molded semiconductor package can have improved reliability.

Since each bottom surface area of the first and second external connection conductors 5a and 5b is larger than the top surface area of the internal connection conductor 4, following operation and effect can be achieved. These operation and effect will be described below with reference to FIG. 6, which is a cross section showing the plastic molded semiconductor package in which the position of the semiconductor chip 1 is deviated in the molding resin 6.

A following problem, which may be caused due to the manufacturing method which will be detailed later, may generate in the case where the semiconductor chip 1 is located at a position deviated from a predetermined position. If the semiconductor chip 1 located at the deviated position is sealed with resin, the positions of the top surfaces of internal connection conductors 4 exposed on the surface of the molding resin 6 are deviated from the predetermined positions. However, the positions of the external connection conductors 5 can be maintained at the predetermined positions in the package owing to the structure in which the bottom surface area of the external connection conductor 5 is larger than the top surface area of the internal connection conductor 4.

Figure 6:
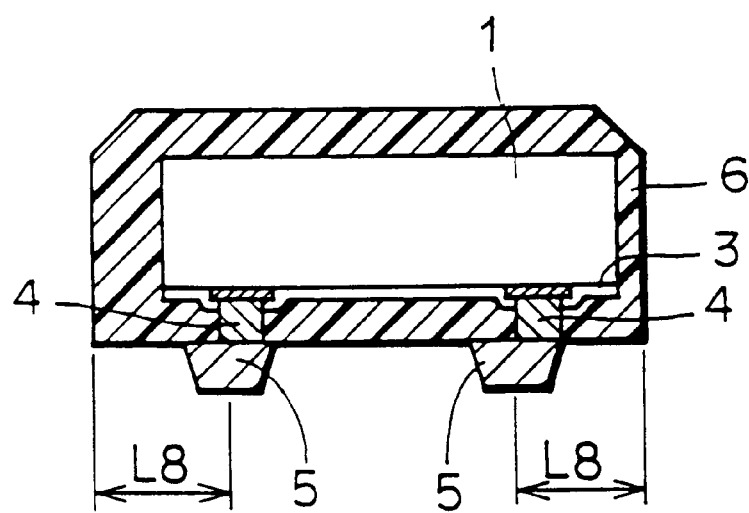
FIG. 6 is a cross section showing a plastic molded semiconductor package of the first embodiment in the case where the position of a semiconductor chip is deviated in a molding resin.

More specifically, even if the positions of the internal connection conductors 4 are deviated due to deviation of the position of the semiconductor chip 1 in the molding resin 6 as shown in FIG. 6, the external connection conductors 5 can be located at predetermined positions in the surface of the molding resin 6 spaced by distances, e.g., of L8 from the side of the package. Thereby, the positions of the external connection conductors 5 in the package can be standardized. Thereby, the joining to the printed board 7 can be performed easily, and the high integration on the printed board 7 is allowed.

Specific structures of the electrode part for external connection will be described below with reference to FIGS. 7–10, which are enlarged fragmentary cross sections showing first to fourth modifications of the structure of the electrode for external connection in the plastic molded semiconductor package of the first embodiment of the invention, respectively.

(1) First Modification

Figure 7:
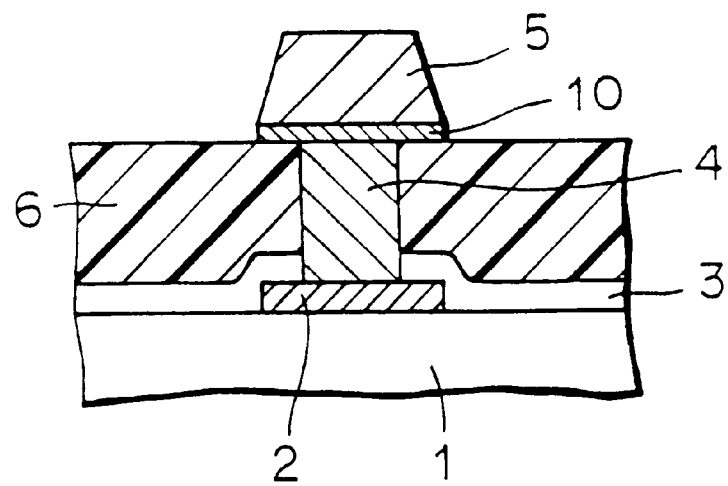
FIGS. 7–10 are cross sections showing first to fourth modifications of an electrode for external connection, respectively.

Referring first to FIG. 7, the electrode structure for external connection in the first modification will be described below. In the modification shown in FIG. 7, an electrically conductive layer 10 is formed between the bottom surface of the external connection conductor 5 and the top surface of the internal connection conductor 4. The conductive layer 10 may be made of gold (Au), chromium (Cr), titanium (Ti) or tungsten (W).

The conductive layer 10 functions as an etching stopper in the etching step for forming the external connection conductor 5. Owing to the provision of the conductive layer 10, the surface of the molding resin 6 is protected when forming the external connection conductor 5. Structures other than those described above are similar to those of the electrode for external connection shown in FIG. 2.

The pad electrode 2 may be made of material such as aluminum (Al). The internal connection conductor 4 may be made of copper (Cu), gold (Au) or solder (Pb/Sn). The second conductor 5 may be made of material such as copper (Cu).

In connection with the structure shown in FIG. 7, a method of connecting the pad electrode 2 to the internal connection conductor 4 will be described below. If the internal connection conductor 4 is made of copper (Cu) or gold (Au), the joining may be performed, e.g., by thermosonic bonding or by thermocompression bonding in reducing atmosphere. If the internal connection conductor 4 is made of solder (Pb/Sn), thermocompression bonding or the like may be selected.

(2) Second Modification

Figure 8:
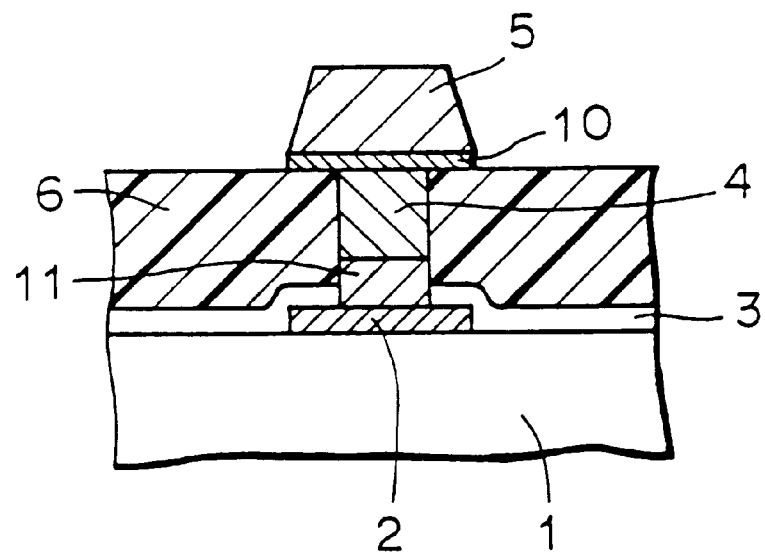

Referring to FIG. 8, a second modification of the electrode for external connection will be described below. In this modification shown in FIG. 8, a connection layer 11 is formed between the bottom surface of the internal connection conductor 4 and the top surface of the pad electrode 2. The connection layer 11 may be made of indium (In), gold (Au) or solder (Pb/Sn). Also, the internal connection conductor 4 may be made of solder (Pb/Sn), copper (Cu) or gold (Au). The external connection conductor 5 and the conductive layer 10 may be made of material similar to those in the first modification.

Methods of joining the pad electrode 2 and the connection layer 11 together and joining the connection layer 11 and the internal connection conductor 4 together will be described below. The connection layer 11 may be joined onto the pad electrode 2 by a plating method or a ball bonding method. The connection layer 11 and the internal connection conductor 4 may be joined together by the thermocompression bonding method or the like.

(3) Third Modification

Figure 9:
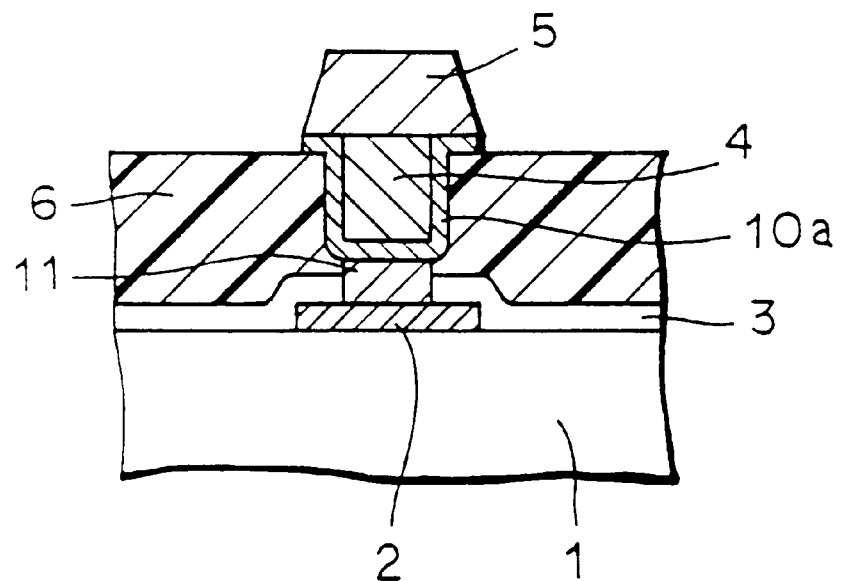

Referring to FIG. 9, a third modification of the electrode for external connection will be described below. In the modification shown in FIG. 9, an electrically conductive layer 10a is formed between the internal connection conductor 4 and the connection layer 11 and on the bottom surface of the external connection conductor 5. Other structures are similar to those of the second modification shown in FIG. 8. The conductive layer 10a may be made of material such as gold (Au).

A method of joining the pad electrode 2 and the connection layer 11 together and a method of joining the conductive layer 10a and the connection layer 11 will be described below. The connection layer 11 on the pad electrode 2 is formed in a manner similar to that in the second modification, i.e., by a plating method, a ball bonding method or the like. The connection layer 11 and the conductive layer 10a are joined together by the thermocompression bonding method or the like.

(4) Fourth Modification

Figure 10:
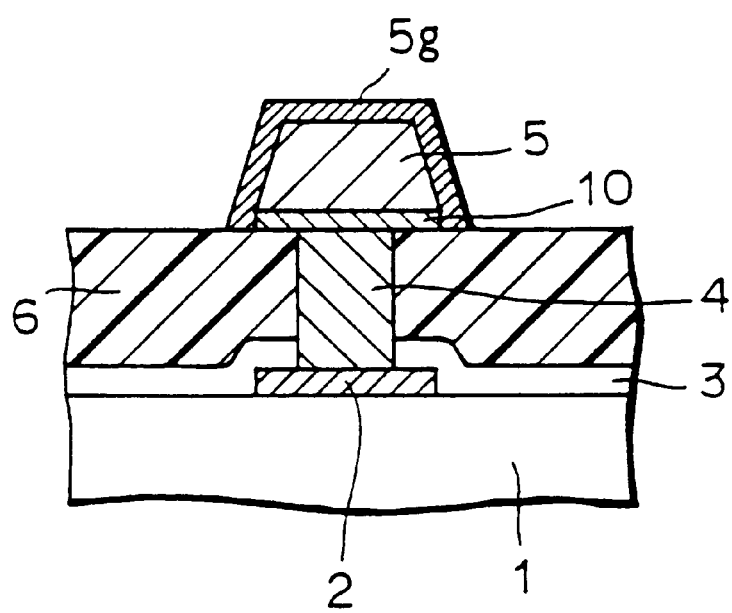

Referring to FIG. 10, a fourth modification of the electrode for external connection will be described below. In this modification shown in FIG. 10, a coating layer 5g is formed on the surface of the external connection conductor 5. Other structure is similar to those of the first modification shown in FIG. 7. The coating layer 5g may be made of tin (Sn), solder (Pb/Sn) or the like, and is formed by an electroless plating method or the like. Owing to the provision of the coating layer 5g, following operation and effect can be achieved.

Improved wettability of the external connection electrode and the electrode (or joining material) formed on the printed board can be obtained when joining the plastic molded semiconductor package on the printed board. Further, formation of an oxide film on the surface of the external connection conductor 5 is suppressed in a reliability test such as burn-in. Thereby, electrical contact to a socket for the test can be easily achieved. Consequently, the reliability test can be performed more surely.

The coating layer 5g described above may be formed on the surface of the external connection conductor 5 in the second and third modifications shown in FIGS. 8 and 9.

A method of manufacturing the plastic molded semiconductor package of the first embodiment will be described below with reference to FIGS. 11–20. In the following description, the manufacturing method will be described in connection with the plastic molded semiconductor package having the electrodes for external connection in the first modification.

Figure 18:
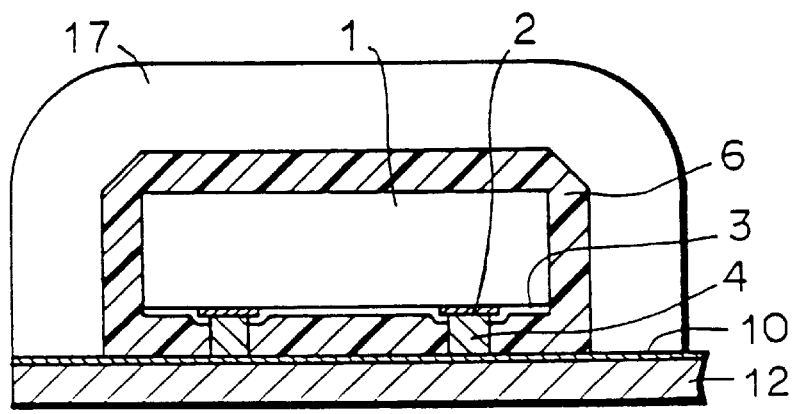
FIG. 18 is a cross section showing a modification of a step of manufacturing the plastic molded semiconductor package of the first embodiment of the invention.
Figure 19:
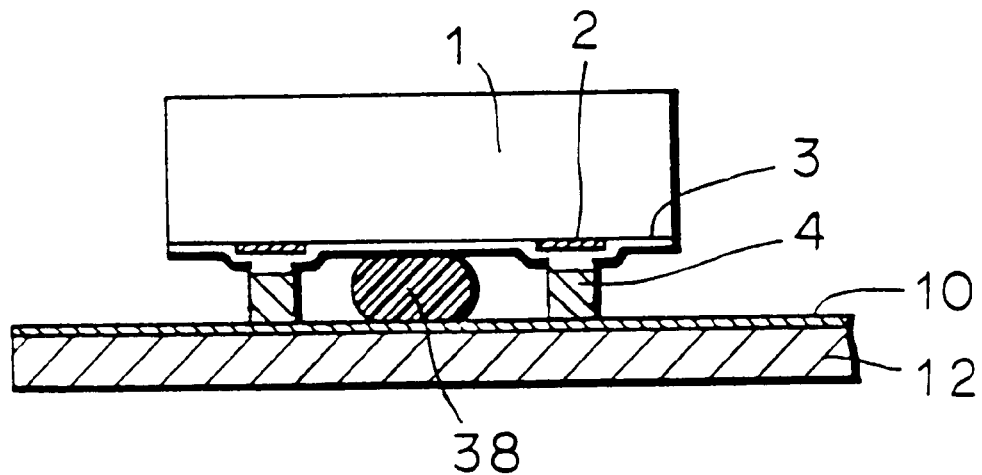
FIGS. 19 and 20 are cross sections showing 1st and 2nd steps in an example of a method of joining pad electrodes to internal connection conductors, respectively.
Figure 20:
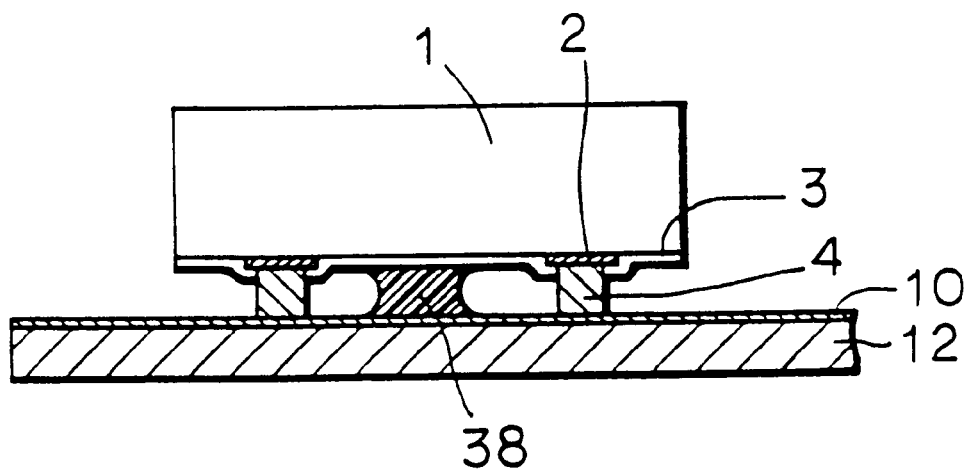

FIGS. 11–17 are perspective views or cross sections showing 1st to 7th steps in a process of manufacturing the plastic molded semiconductor package of the first embodiment of the invention, respectively. FIG. 18 is a cross section showing a modification of a process of manufacturing the plastic molded semiconductor package in the first embodiment. FIGS. 19 and 20 are cross sections showing a modification of a method of joining the internal connection conductors 4 to the pad electrodes 2.

Figure 11:
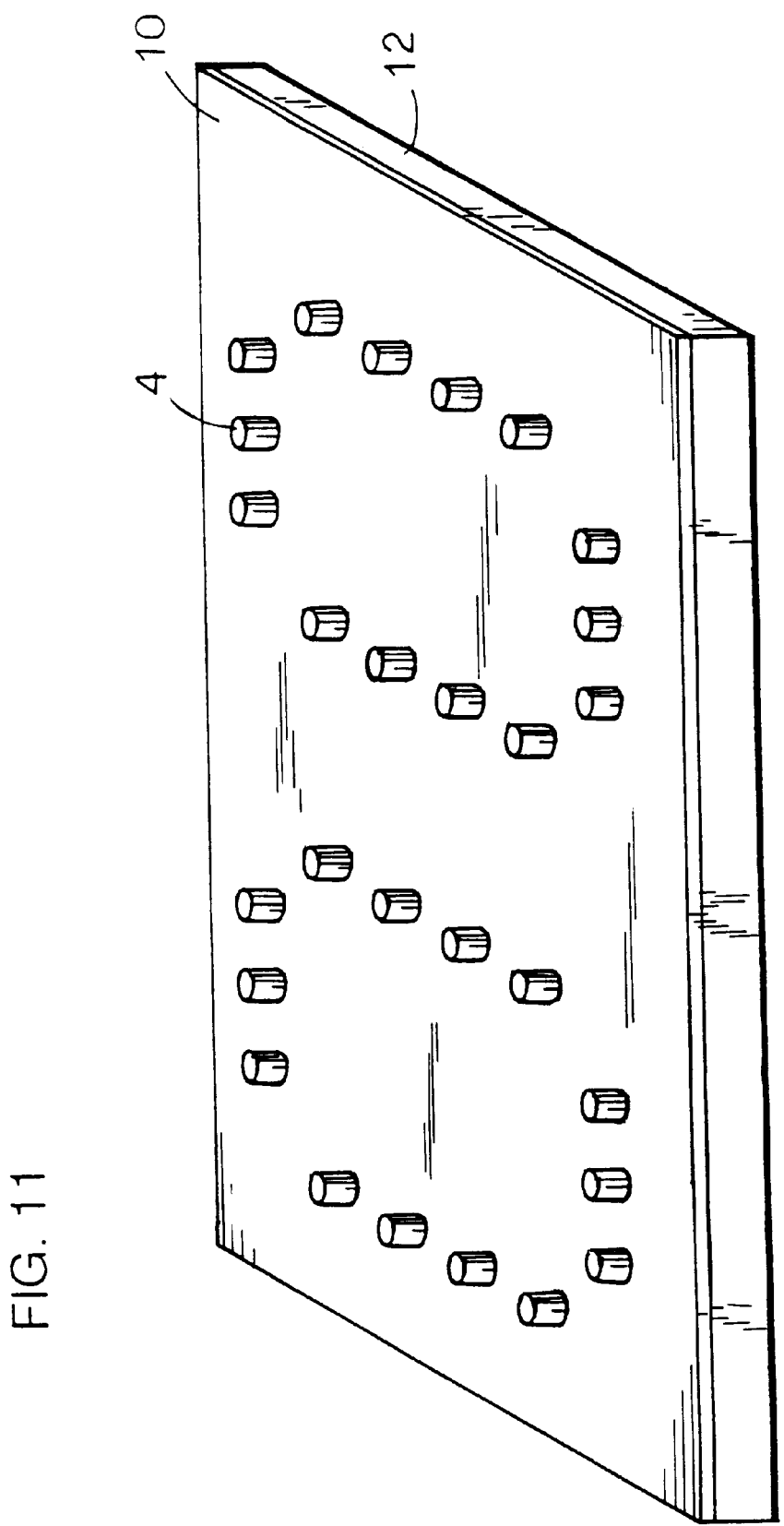
FIGS. 11 and 12 are perspective views showing 1st and 2nd steps in a process of manufacturing the plastic molded semiconductor package of the first embodiment of the invention, respectively.

Referring first to FIG. 11, a metal foil 12 having a predetermined thickness is prepared. The metal foil 12 may be made of copper (Cu) or others. The thickness of the metal foil 12 is preferably 18 μm to 200 μm. The thickness of the metal foil 12 decides the height of the external connection conductor 5, which will be formed in a subsequent step, from the surface of the molding resin 6.

The conductive layer 10 is formed on the surface of the metal foil 12 by the vapor deposition or the like. The conductive layer 10 may be made of chromium (Cr), titanium (Ti), tungsten (W) or the like. The conductive layer 10 preferably has a thickness of about 500 Å to about 1000 Å. The conductive layer 10 functions as an etching stopper when the external connection conductor 5 is formed by etching the metal foil 12.

The internal connection conductors 4 are formed at predetermined positions on the surface of the conductive layer 10. The internal connection conductors 4 may be made of copper (Cu), gold (Au), solder (Pb/Sn) or the like, and are formed by the electroplating method, ball bonding method or the like.

The internal connection conductor 4 preferably has a thickness of 25 μm to 150 μm. Owing to the relatively large height of the internal connection conductor 4, the material of molding resin 6 can easily flow into spaces between the internal connection conductors 4 in a subsequent encapsulation step.

Figure 12:
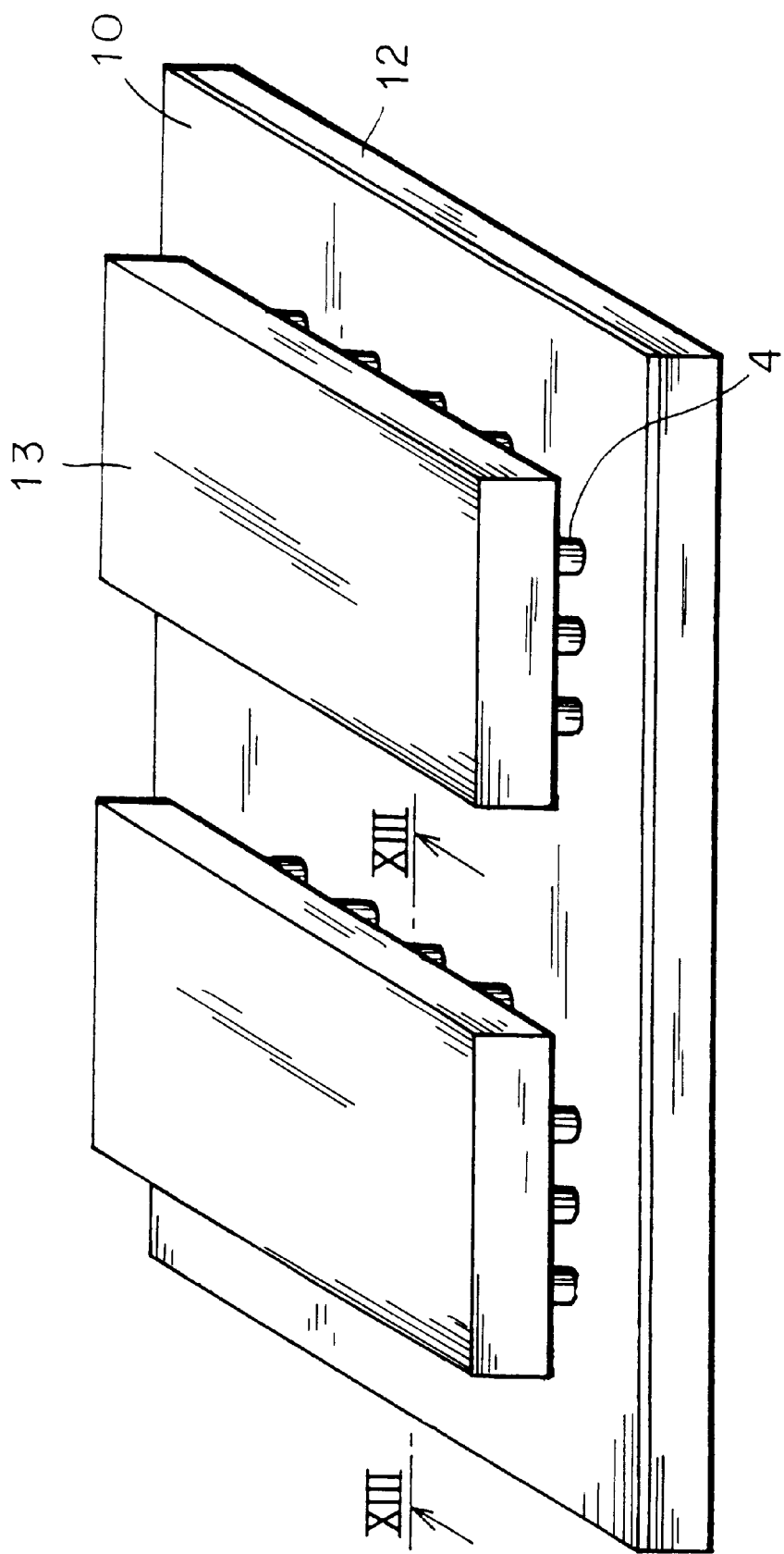

Referring to FIG. 12, the semiconductor chips 13 in which the pad electrodes 2 have already been formed are laid on the internal connection conductors 4. In this case, two semiconductor chips 13 laid on the metal foil 12. In the case where the long dimension metal foil 12 is used and many internal connection conductors 4 are formed thereon, a large number of semiconductor chips 13 may be disposed in parallel to each other on the metal foil 12. This improves the productivity.

Figure 13:
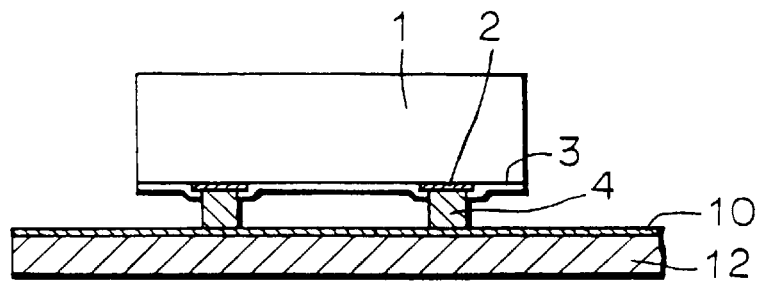
FIGS. 13–17 are cross sections showing 3rd to 7th steps in the process of manufacturing the plastic molded semiconductor package of the first embodiment of the invention, respectively.

FIG. 13 is a cross section taken along line XIII—XIII in FIG. 12. FIGS. 14–20 which will be referred to later also show similar sections. Referring to FIG. 13, the pad electrodes 2 are disposed on the internal connection conductors 4, and then the internal connection conductors 4 are joined to the pad electrodes 2. A method of joining them is similar to that already described in connection with the first modification of the electrode structure for external connection, and hence will not be described below.

Figure 14:
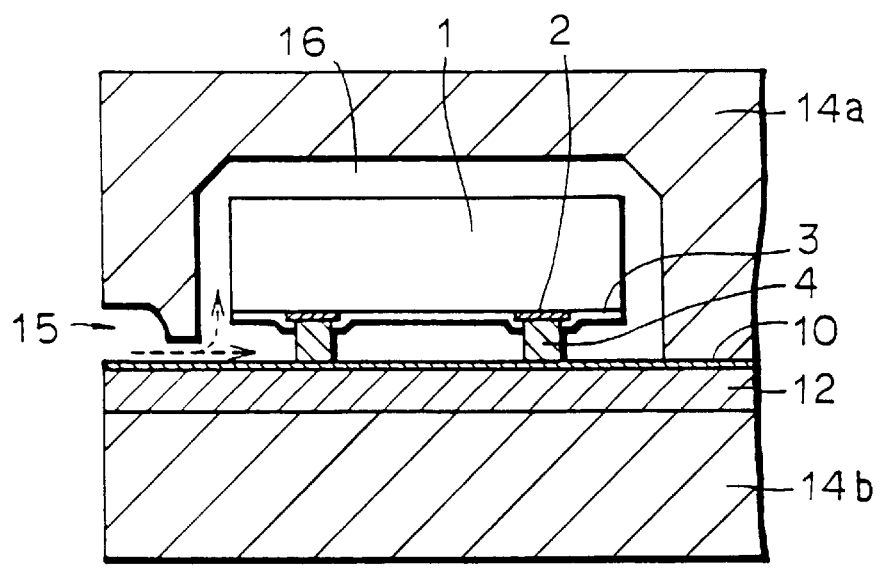

Referring to FIG. 14, first and second dies (molding dies) 14a and 14b to be combined together are prepared. The metal foil 12 is pinched by the first and second dies 14a and 14b. In this operation, the semiconductor chip 1 is located in a cavity 16 defined by the first and second dies 14a and 14b. The first and second dies 14a and 14b have a resin inlet 15 through which molding resin 6 is injected.

The resin is injected through the resin inlet 15 into the cavity 16. In this operation, the metal foil 12 is held by the first and second dies 14a and 14b, and the semiconductor chip 1 is fixed to the metal foil 12. Thereby, the position of the semiconductor chip 1 is fixed in the cavity 16. Consequently, the encapsulation can be performed stably by transfer mold method.

Figure 15:
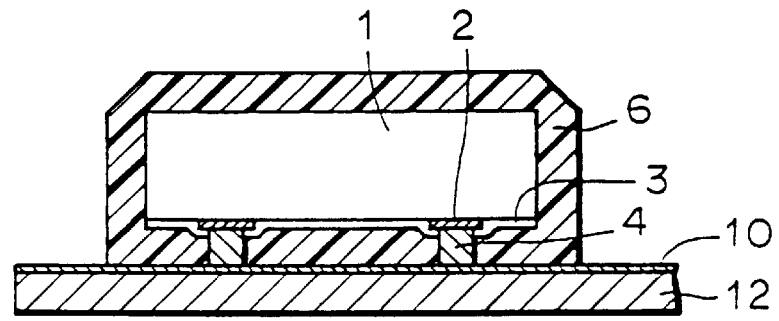

Referring to FIG. 15, after filling up the resin into the cavity 16, the first and second dies 14a and 14b are removed. Thereby, the semiconductor chip 1 encapsulated with resin is obtained as shown in FIG. 15.

Figure 16:
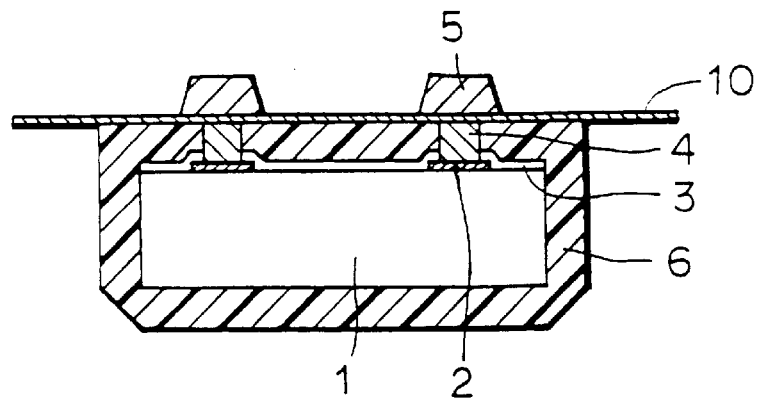

Referring to FIG. 16, the metal foil 12 is etched into a predetermined configuration to form the external connection conductors 5, during which the conductive layer 10 serves as an etching stopper. Therefore, corrosion of the main surface of the molding resin is suppressed.

Since the external connection conductors 5 are formed by etching the metal foil in this manner, the external connection conductors 5 protruded from the surface of the molding resin 6 can have a substantially uniform height. Also, various configurations of the external connection conductor 5 can be selected by controlling the conditions of etching and/or the configuration of a mask used for the etching.

Figure 17:
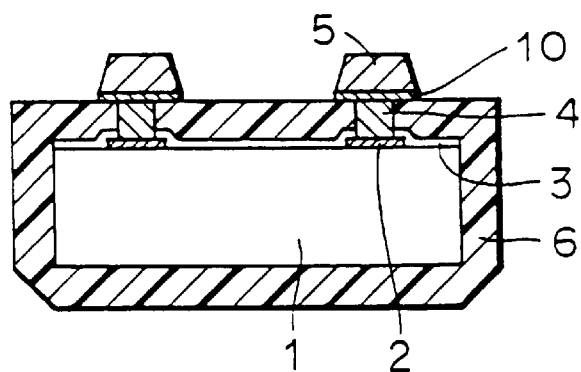

Referring to FIG. 17, the conductive layer 10 is patterned by the dry etching method to leave the conductive layers 10 only under the bottom surfaces of the external connection conductors 5. Since the conductive layer 10 has a small thickness of 500 Å to 1000 Å, unpreferable influence is hardly exerted upon the surface of the molding resin 6. In the manner described above, the plastic molded semiconductor package of the first embodiment is completed.

Referring to FIG. 18, a modification of a method of manufacturing the plastic molded semiconductor package of the first embodiment will be described below. In FIG. 18, silicon resin 17, which covers the molding resin 6 and can be removed in a subsequent stage, may be formed prior to the etching of the metal foil 12. This protects the surface of the molding resin more reliably.

Referring to FIGS. 19 and 20, a modification of a method of joining the internal connection conductor 4 and the pad electrode 2 together will be described below. Referring first to FIG. 19, hardening resin (thermosetting resin or the like) 38 which can be hardened by light or heat is interposed between the semiconductor chip 1 and the conductive layer 10 formed on the metal foil 12. Referring to FIG. 20, light or heat is applied to the hardening resin 38 to shrink and harden the same. Thereby, the internal connection conductors 4 are brought into contact with the pad electrodes 2. In this manner, the pad electrodes 2 and the internal connection conductors 4 may be connected to each other.

(Second Embodiment)

Figure 21:
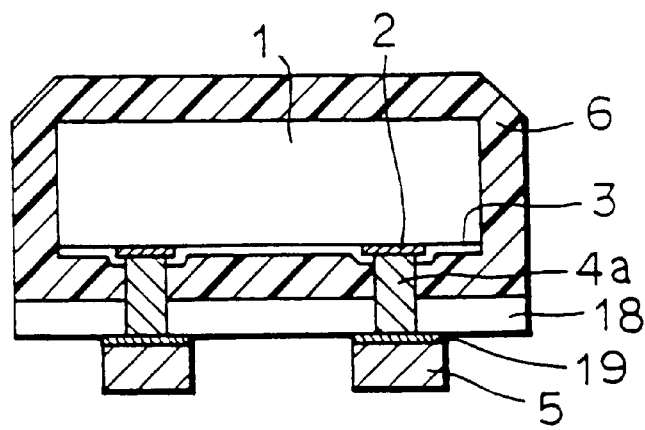
FIG. 21 is a cross section showing a plastic molded semiconductor package of a second embodiment of the invention.

Referring to FIGS. 21–34, a second embodiment of the invention will be described below. FIG. 21 is a cross section showing a plastic molded semiconductor package of a second embodiment of the invention. FIGS. 22–25 are cross sections showing 1st to 4th steps in a process of manufacturing the plastic molded semiconductor package shown in FIG. 21, respectively.

Referring to FIG. 21, structures of the plastic molded semiconductor package of the second embodiment of the invention will be described below. In this embodiment shown in FIG. 21, an insulating base material (insulating sheet) 18 is provided on the main surface of the molding resin 6. The external connection conductor 5 has a rectangular parallelepipedic form. It can have column or hemisphere form or others. Other structures are similar to those of the plastic molded semiconductor package of the first embodiment shown in FIG. 17. The insulating base material 18 may be formed of tape of polyimide or the like. Owing to the provision of this insulating base material 18, the moisture resistance can be improved, compared with the prior art.

Referring to FIGS. 22–25, a method of manufacturing the plastic molded semiconductor package of the second embodiment of the invention will be described below.

Figure 22:
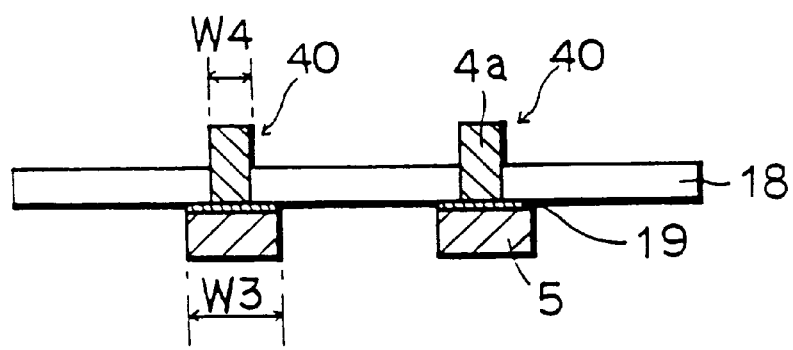
FIGS. 22–25 are cross sections showing 1st to 4th steps in a process of manufacturing the plastic molded semiconductor package of the second embodiment of the invention, respectively.

Referring to FIG. 22, the insulating base material 18 having penetration bumps 40 are prepared. Each penetration bump 40 is formed of the external connection conductor 5, conductive layer 19 and internal connection conductor 4a. The external connection conductor 5 and the internal connection conductor 4a may be made of copper (Cu), gold (Au), solder (Pb/Sn) or the like. The conductive layer 19 may be made of material similar to the conductive layer 10 in the first embodiment.

In the penetration bump shown in FIG. 22, a plane width W3 of the external connection conductor 5 is preferably larger than a plane width W4 of the internal connection conductor 4a. Thereby, the mounting to the printed board can be easily performed.

Figure 23:
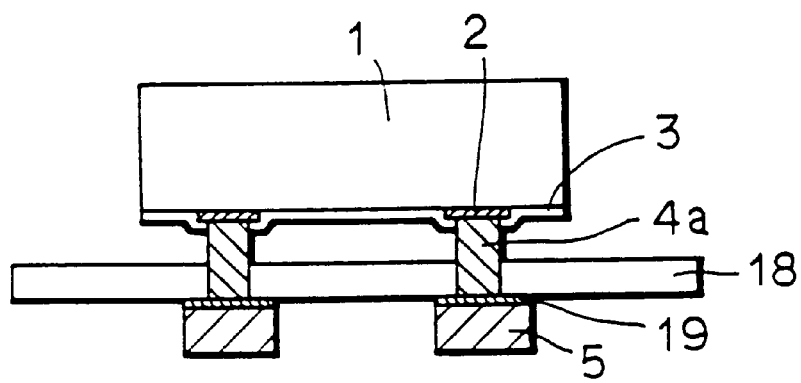

Referring to FIG. 23, the semiconductor chip 1 is laid over the insulating base material 18 having the penetration bumps 40 shown in FIG. 22, so that the pad electrodes 2 are located on the internal connection conductors 4a. The pad electrodes 2 and the internal connection conductors 4a are joined together in a method similar to that in the first embodiment.

In this operation, the insulating base material 18 may be formed of a long tape-like material provided with many penetration bumps 40. This enables simultaneous disposition of many semiconductor chips 1 on the insulating base material 18, and thus can improve the productivity.

Figure 24:
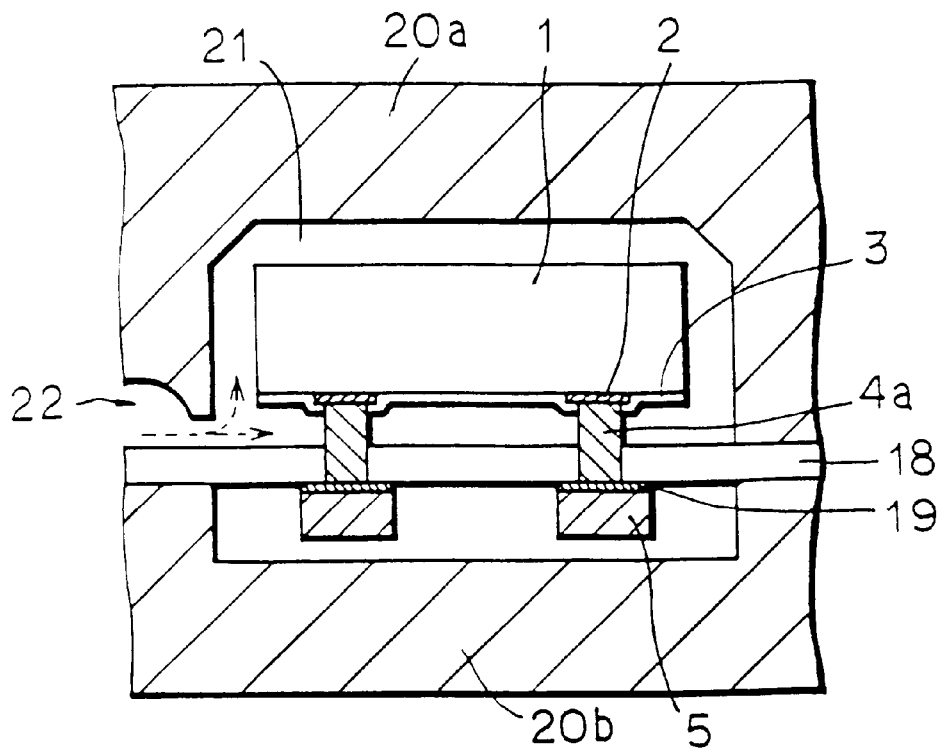

Referring to FIG. 24, first and second dies 20a and 20b having a space for receiving the semiconductor chip(s) 1 are prepared. The insulating base material 18 is pinched by the first and second dies 20a and 20b, so that the semiconductor chip 1 is disposed in a cavity 21 defined by the first and second dies 20a and 20b.

In this operation, the semiconductor chip 1 is fixed to the insulating base material 18, which is fixedly held by the first and second dies 20a and 20b. Therefore, the semiconductor chip 1 is fixed in the cavity 21. Therefore, the position of the semiconductor chip 1 is hardly deviated when the material of molding resin 6 is injected into the cavity 21. Thus, the encapsulation can be performed more surely and stably by transfer mold method.

The first and second dies 20a and 20b are provided at a predetermined position with a resin inlet 22 for injecting the resin into the cavity 21. The resin is supplied through the resin inlet 22 into the cavity 21. The first and second dies 20a and 20b may be provided with a plurality of cavities 21, in which case a plurality of semiconductor chips 1 can be simultaneously encapsulated with the resin. This improves the productivity.

Figure 25:
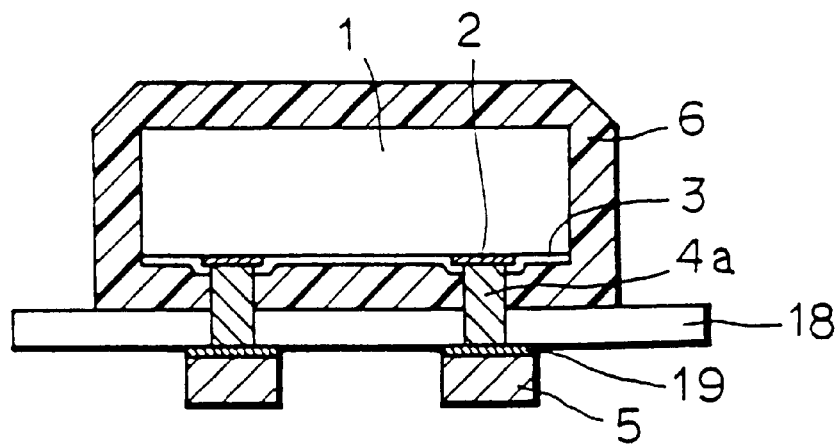

Referring to FIG. 25, the first and second dies 20a and 20b are removed after the filling up resin into the cavity 21. In this manner, the semiconductor chip 1 is encapsulated with the resin. Thereafter, the insulating base material 18 is cut at predetermined positions to form end surfaces of the insulating base material 18 which are coplanar with the surfaces of the molding resin 6.

The plastic molded semiconductor package shown in FIG. 21 is completed through the steps described above. According to the manufacturing method of the second embodiment, the insulating base member having the penetration bumps 40 can be formed in advance in an independent step. Thereby, the process of manufacturing the plastic molded semiconductor package itself can be simpler than the first embodiment.

Referring to FIGS. 26–34, the method of forming the penetration bumps 40 shown in FIG. 22 will be described below.

FIGS. 26–30 are cross sections showing 1st to 5th steps in a process of forming the penetration bumps 40 shown in FIG. 22, respectively.

Figure 26:
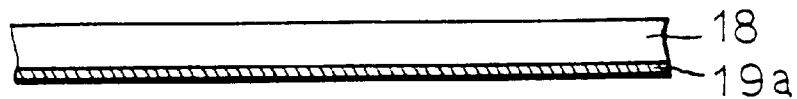
FIGS. 26–30 are cross sections showing 1st to 5th steps in a method of forming penetrating bumps of the second embodiment of the invention, respectively.

Referring to FIG. 26, a conductive layer 19a is formed on the surface of the insulating base material 18 by the spattering method, vapor deposition method or the like. The conductive layer 19a preferably has a thickness of about 500 Å to 1000 Å.

Figure 27:
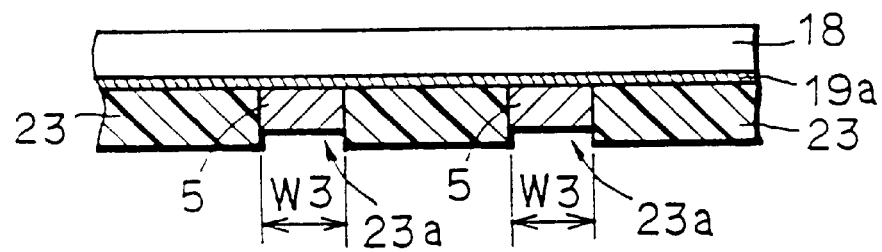

Referring to FIG. 27, resist is applied onto the conductive layer 19a. Openings 23a each having an opening width of W3 are formed in the resist to form a resist pattern 23. An electroplating method or the like is used to deposit the external connection conductors 5 in the openings 23a.

Figure 28:
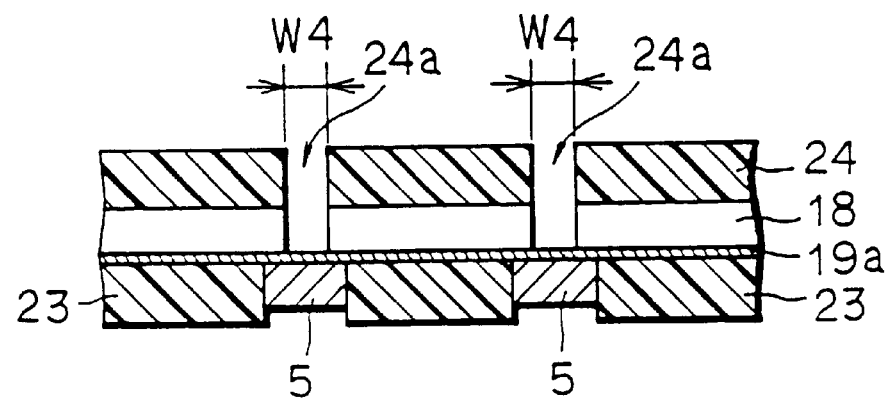

Referring to FIG. 28, resist is applied onto the surface of the insulating base material 18 not covered with the conductive layer 19a. Openings 24a each having an opening width of W4 is formed at predetermined positions in this resist to form a resist pattern 24. Using this resist pattern 24 as a mask, the insulating base material 18 is etched to expose the conductive layer 19a in bottoms of the openings 24a.

Figure 29:
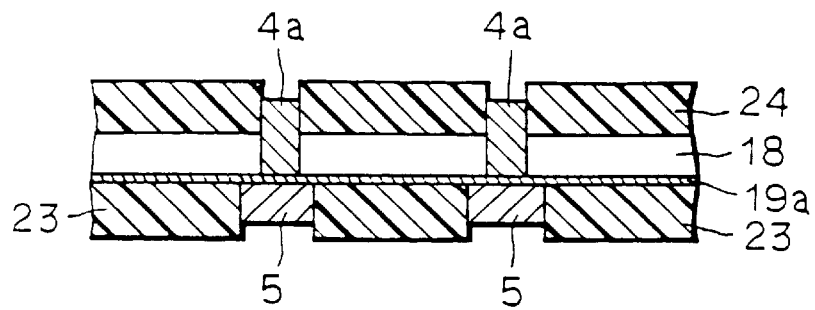

Referring to FIG. 29, an electroplating method is used to deposit the internal connection conductors 4a in the openings 24a.

Figure 30:
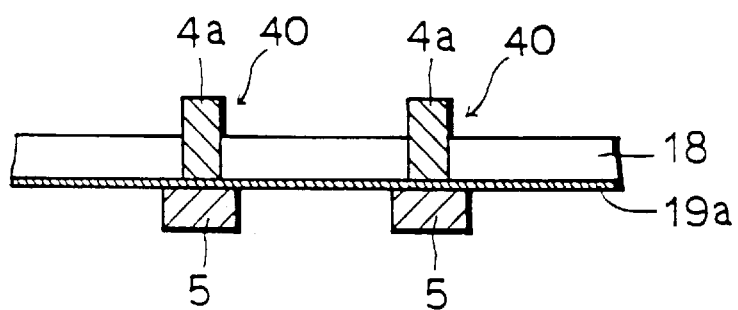

Referring to FIG. 30, the resist patterns 23 and 24 are removed. Thereafter, dry etching or the like is used to selectively remove the conductive layer 19a. Thereby, the insulating base material 18 having the penetration bumps 40 shown in FIG. 22 is completed.

Figure 31:
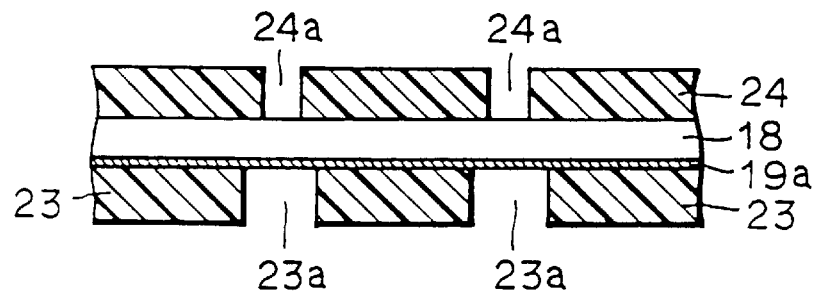
FIGS. 31–34 are cross sections showing 1st to 4th steps of another method of forming the penetrating bumps of the second embodiment of the invention, respectively.

Referring to FIGS. 31–34, another method of forming the penetration bumps 40 shown in FIG. 22 will be described below. Referring to FIG. 31, the resist pattern 23 having the openings 23a are formed on the surface of the conductive layer 19a, and the resist pattern 24 having the openings 24a are formed on the surface of the insulating base material 18 not covered with the conductive layer 19a.

Figure 32:
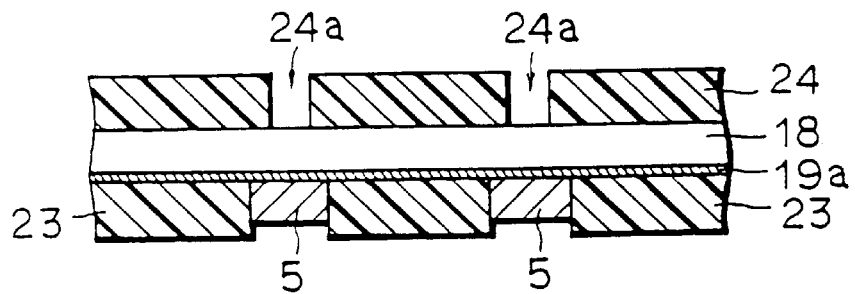
Figure 33:
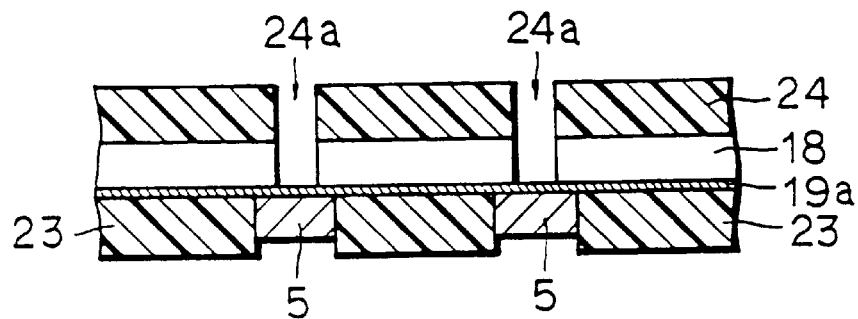
Figure 34:
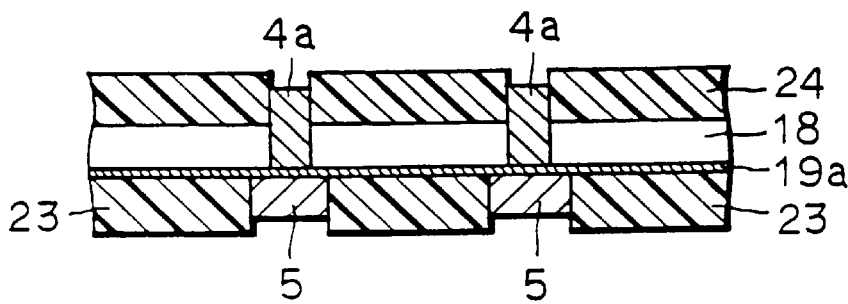

Referring to FIG. 32, the external connection conductors 5 are deposited on the surface of the conductive layer 19a by the electroplating method. Then, as shown in FIG. 33, the conductive layer 19a is exposed in the bottoms of the openings 24a by the etching which uses the resist pattern 24 as a mask.

The electroplating method is used to deposit the internal connection conductors 4a in the openings 24a. Then, the resist patterns 23 and 24 are selectively removed in a manner similar to the case already described, whereby the penetration bumps 40 shown in FIG. 22 are completed.

(Third Embodiment)

Figure 35:
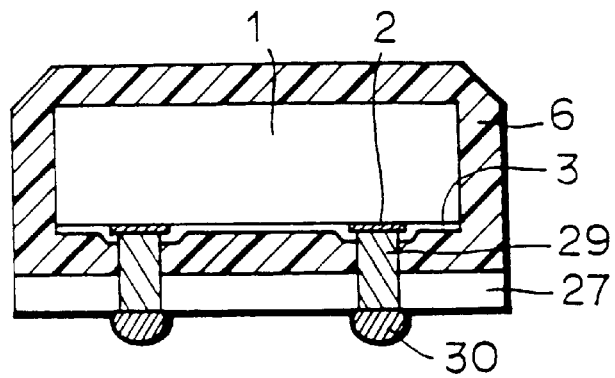
FIG. 35 is a cross section showing a plastic molded semiconductor package of a third embodiment of the invention.
Figure 39:
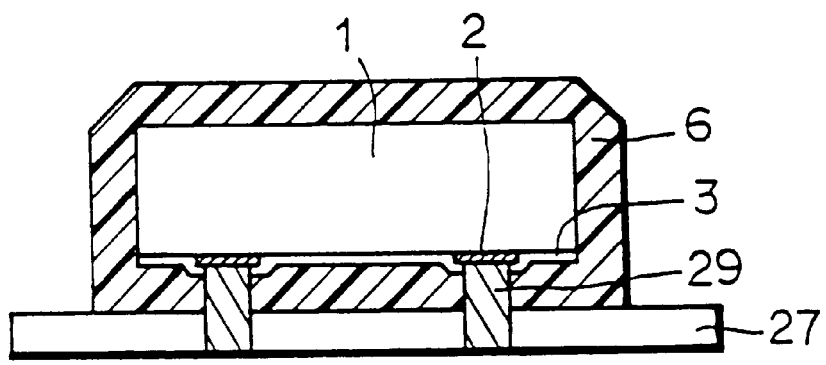
Figure 40:
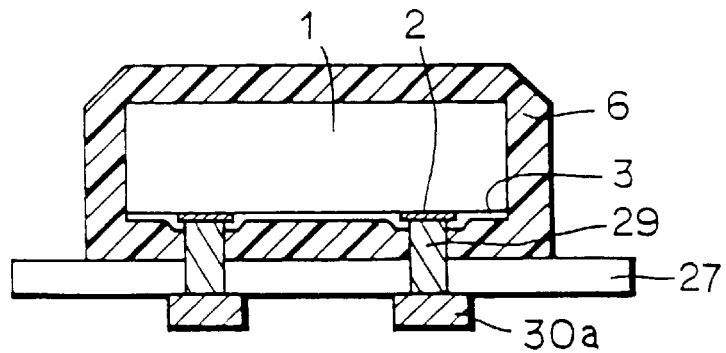
Figure 41:
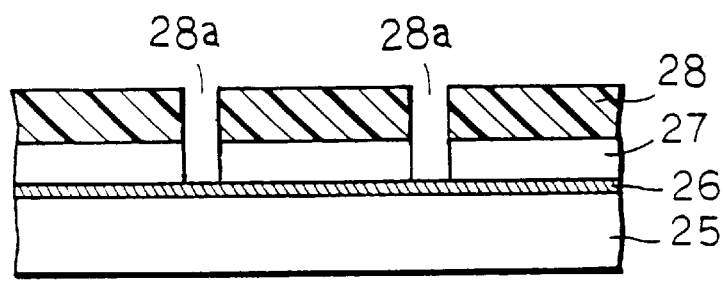
FIGS. 41 and 42 are cross sections showing 1st and 2nd steps in a method of forming penetrating bumps in the third embodiment of the invention.
Figure 42:
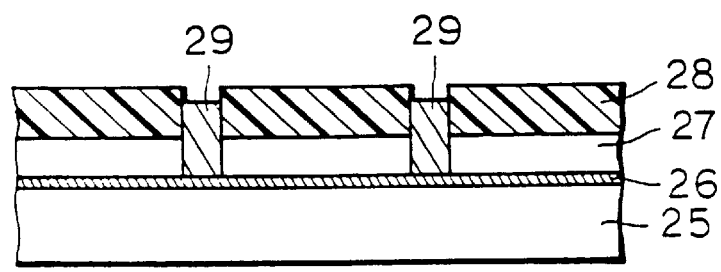

Referring to FIGS. 35–42, a third embodiment of the invention will be described below. FIG. 35 is a cross section showing a plastic molded semiconductor package of the third embodiment of the invention. FIGS. 36–40 are cross sections showing 1st to 5th steps in a process of manufacturing the plastic molded semiconductor package of the third embodiment of the invention, respectively. FIGS. 41 and 42 are cross sections showing 1st and 2nd steps in a process of forming an insulating base member having penetration bumps which is used in a process of manufacturing the plastic molded semiconductor package of the third embodiment of the invention, respectively.

Referring first to FIG. 35, structures of the plastic molded semiconductor package of the third embodiment of the invention will be described below. In the embodiment shown in FIG. 35, external connection conductors 30 have curved outer surfaces. This is due to a method of forming the external connection conductors 30.

The external connection conductors 30 may be made of material such as solder (Pb/Sn). A conductive layer corresponding to that in the second embodiment is not formed between an internal connection conductor 29 and the external connection conductor 30. Other structures are similar to those of the plastic molded semiconductor package of the second embodiment.

Figure 36:
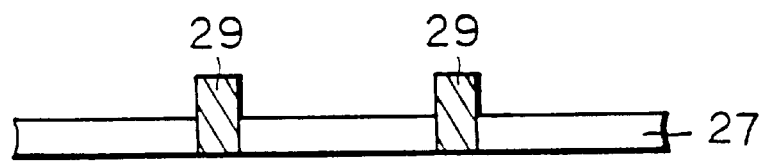
FIGS. 36–40 are cross sections showing 1st to 5th steps in a process of manufacturing a plastic molded semiconductor package of a third embodiment of the invention, respectively.

The method of manufacturing the plastic molded semiconductor package of this embodiment will be described below with reference to FIGS. 36 to 40. Referring to FIG. 36, there is prepared an insulating base material 27, which is formed of the same material as insulating base material 18, having penetration bumps (internal connection conductors) 29. In this embodiment, each penetration bump 29 is protruded from only one side of the insulating base material (insulating sheet) 27.

Figure 37:
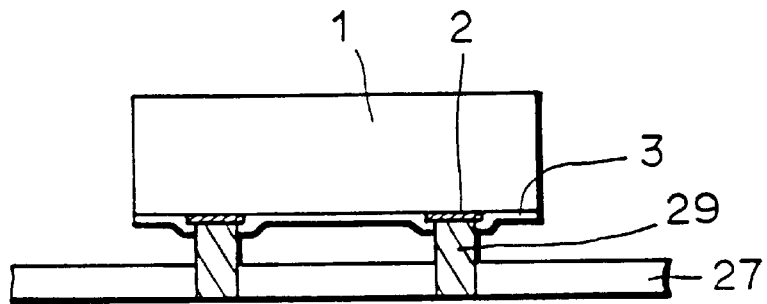

Referring to FIG. 37, the semiconductor chip 1 is laid over the insulating base material 27, so that the pad electrodes 2 are located on the penetration bumps 29. The pad electrodes 2 and the penetration bumps 29 are joined together. The penetration bumps 29 may be made of copper (Cu), gold (Au), solder (Pb/Sn) or the like, similarly to the second embodiment. The method of joining the pad electrodes 2 and the penetration bumps (internal connection conductors) 29 together may be similar to that in the first embodiment.

Figure 38:
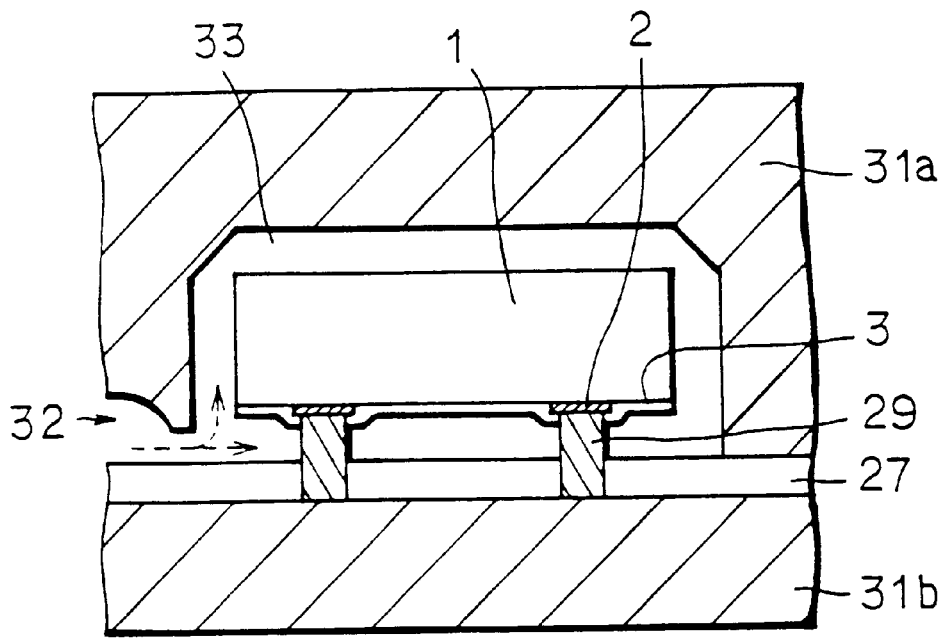

Referring to FIG. 38, there are prepared first and second dies 31a and 31b which internally define a cavity 33 for receiving the semiconductor chip 1. The insulating base material 27 is pinched by the first and second dice 31a and 31b. Thereby, the semiconductor chip 1 is located in the cavity 33 as shown in FIG. 38.

The first and second dies 31a and 31b are provided with a resin inlet 32, through which resin is introduced into the cavity 33. Meanwhile, the semiconductor chip 1 is fixed to the insulating base material 27, which is fixedly held by the first and second dies 31a and 31b. Therefore, the semiconductor chip 1 can be surely and stably encapsulated with the resin.

Referring to FIG. 39, the first and second dies 31a and 31b are removed after introducing the resin into the cavity 33. Thereby, the semiconductor chip 1 encapsulated with the molding resin 6 is completed as shown in FIG. 39.

Referring to FIG. 40, a screen printing method or the like is utilized to form external connection conductor materials 30a on surface portions of the internal connection conductors 29 which are exposed on the surface of the insulating base material 27. Heat treatment is effected on the external connection conductor materials 30a to melt them.

Thereby, the external connection conductors 30 having the configurations shown in FIG. 35 are completed. Then, the insulating base material 27 is cut at predetermined positions, so that the end surfaces of the insulating base material 27 are coplanar with the surfaces of the molding resin 6. Through the steps described above, the plastic molded semiconductor package shown in FIG. 35 is completed.

Referring to FIGS. 41 and 42, the method of forming the insulating base material 27 having the penetration bumps (internal connection conductors) 29 shown in FIG. 36 will be described below. Referring to FIG. 41, a base member 25 provided with a conductive layer 26 is prepared, e.g., by a vapor deposition method. The conductive layer 26 may be made of material such as ITO (indium tin oxide).

The insulating base material 27 is disposed on the conductive layer 26. Resist is applied onto the insulating base material 27, and openings 28a are formed in the resist to complete a resist pattern 28. Using the resist pattern 28 as a mask, the insulating base material 27 is etched. Thereby, a surface of the conductive layer 26 is partially exposed.

Referring to FIG. 42, an electroplating method is used to form the penetration bumps (internal connection conductors) 29 in the openings 28a. After removing the base member 25, the resist 28 is removed. Thereby, the insulating base material 27 having the penetration bumps 29 shown in FIG. 36 is completed. The base member 25 provided with the conductive layer 26 can be used semipermanently.

The second and third embodiments already described use the insulating base material 18 and 27. Multilayer base plates may be used instead of the insulating base material 18 and 27. The multilayer base plate may be made of glass epoxy, copper polyimide, or the like. If the multilayer base plate is used, it is not necessary to dispose the internal connection conductors and external connection conductors at the same positions in a plane view because interconnections can be arranged and extended in an intermediate layer thereof. Therefore, positions of pins can be determined without being restricted by a layout of the chips.

(Fourth Embodiment)

Figure 43:
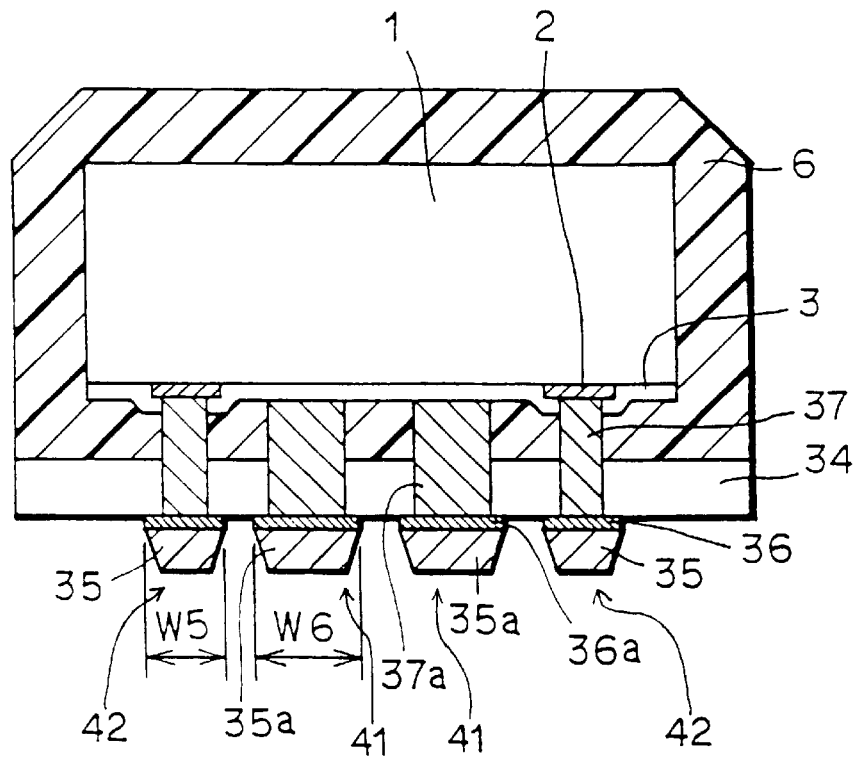
FIG. 43 is a cross section showing a plastic molded semiconductor package of a fourth embodiment of the invention.
Figure 44:
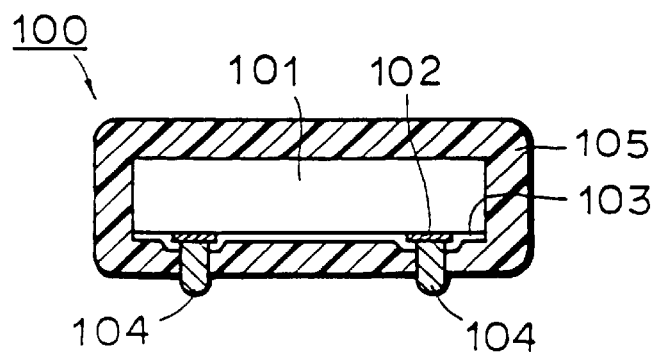
FIG. 44 is a cross section showing an example of a conventional plastic molded semiconductor package.
Figure 45:
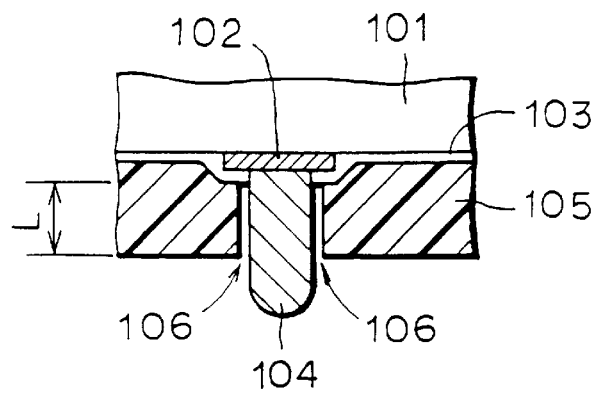
FIG. 45 is an enlarged fragmentary cross section for showing a first problem of the conventional plastic molded semiconductor package.
Figure 46:
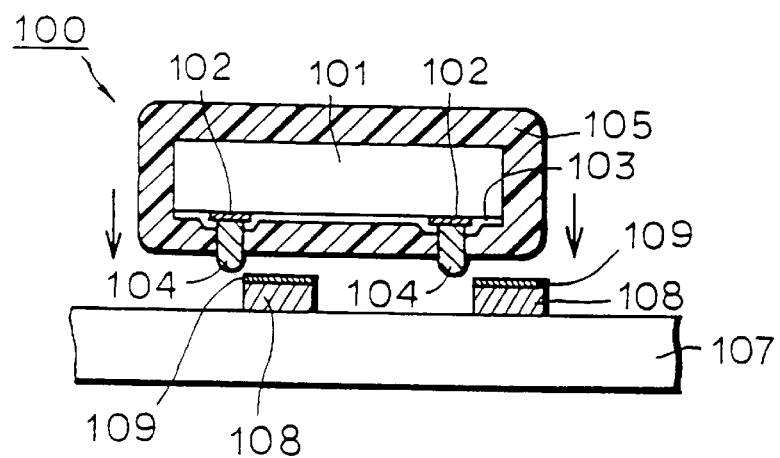
FIGS. 46 and 47 are cross sections showing second and third problems of the conventional plastic molded semiconductor package.
Figure 47:
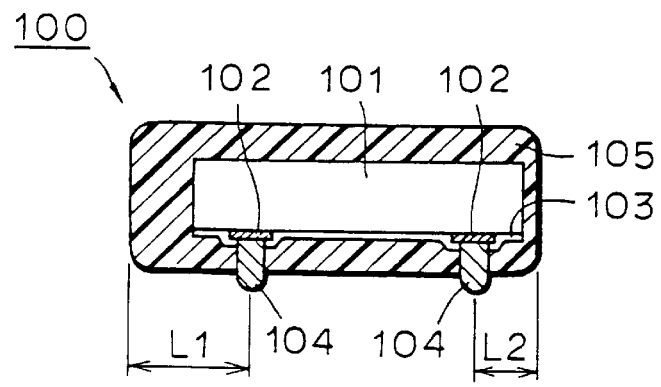
Figure 48:
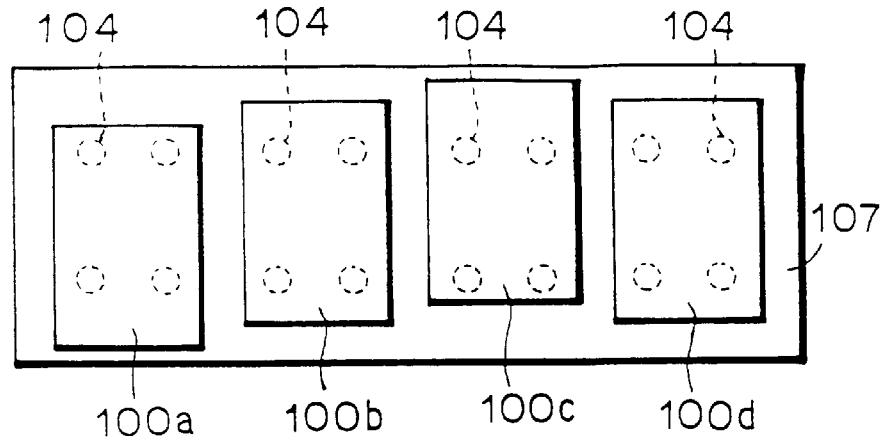
FIG. 48 is a plan for showing another problem caused by the third problem of the conventional plastic molded semiconductor package.
Figure 49A:
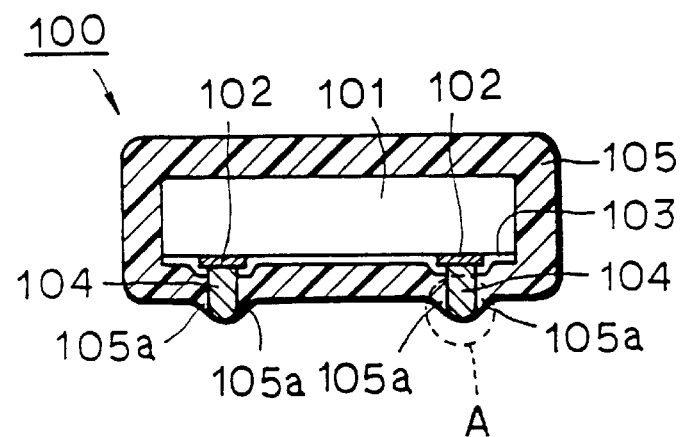
FIG. 49A is a cross section for showing a fourth problem of the conventional plastic molded semiconductor package.
Figure 49B:
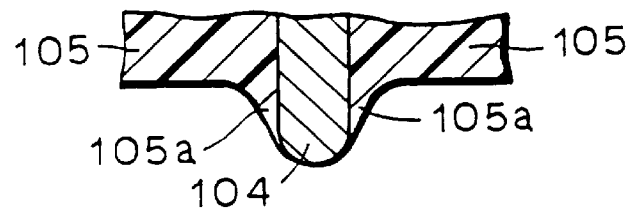
FIG. 49B is an enlarged cross section showing a region A in FIG. 49A.
Figure 50A:
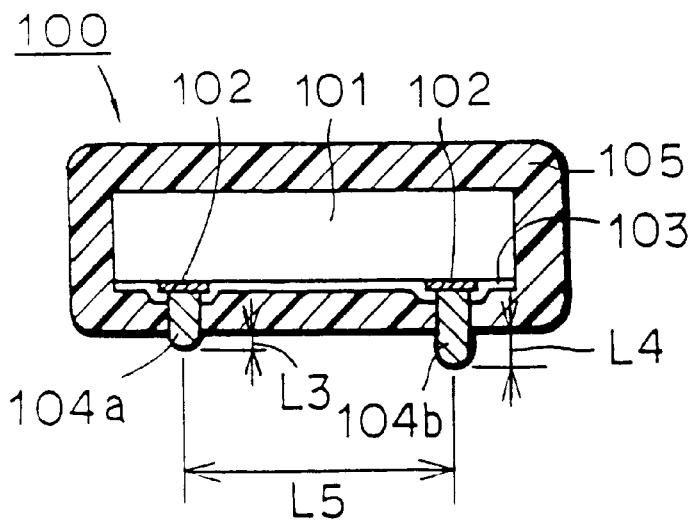
FIGS. 50A and 50B are cross sections showing a fifth problem of the conventional plastic molded semiconductor package.
Figure 50B:
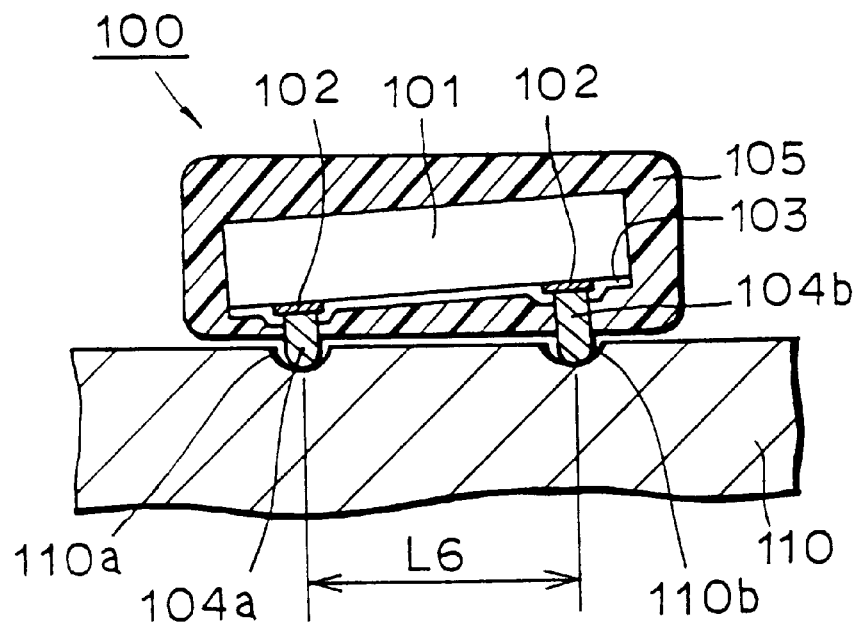

Referring to FIG. 43, a fourth embodiment of the invention will be described below. FIG. 43 is a cross section showing a plastic molded semiconductor package of the fourth embodiment of the invention.

The embodiment shown in FIG. 43 includes bumps 42 for external connection (i.e., electrodes for external connection) for receiving and sending electric signals and also includes bumps 41 for heat radiation which do not concern with the transmission of electric signals. Other structures are similar to those of the plastic molded semiconductor package of the second embodiment shown in FIG. 21. Owing to provision of the bumps 41 for heat radiation, the plastic molded semiconductor package can have a good heat radiating characteristic.

Structures of the bumps 42 for external connection and the bumps 41 for heat radiation will be described below. Each bump 42 for external connection includes an internal connection conductor 37 electrically connected to the pad electrode 2, a conductive layer 36 and an external connection conductor 35. Each bump 41 for heat radiation includes a first conductor 37a which is in contact with the passivation film 3 formed on the main surface of the semiconductor chip 1, an electrically conductive layer 36a and a second conductor 35a.

The internal connection conductor 37 and first conductor 37a are preferably made of the same material. The conducive layers 36 and 36a are preferably made of the same material. Further, the external connection conductor 35 and second conductor 35a are preferably made of the same material. Thereby, the bumps 41 for heat radiation and the bumps 42 for external connection can be formed in the same step. Therefore, the plastic molded semiconductor package having a good heat radiating characteristic can be manufactured without deteriorating the productivity.

In the form shown in FIG. 43, the second conductor 35 of the bump 41 for heat radiation has a plane width W6 larger than the plane width W5 of the external connection conductor 35 of the bump 42 for external connection. The plane width W5 of the external connection conductor 35 is preferably about 0.1 mm to 0.5 mm. The plane width W6 of the second conductor 35a is preferably about 2 mm or more. Thereby, the bumps 41 for heat radiation can ensure a good heat radiating characteristic. The bump 41 for heat radiation, however, may have the same sizes as the bump 42 for external connection.

The bump 41 for heat radiation may be made of material different from that of the bump 42 for external connection.

In this case, the bump 41 for heat radiation and the bump 42 for external connection may be made of materials which can further improve characteristics of them. As a result, the plastic molded semiconductor package can have a high performance. The bump 41 for heat radiation and the bump 42 for external connection are formed penetrating through the insulating base material (which formed of the same material as insulting base material 18) 34.

It is not essential to bring the bottom surfaces of the first conductors 37a into contact with the passivation film 3, and the bottom surfaces of the first conductors 37a may be located at the vicinity of the passivation film 3.

According to the plastic molded semiconductor package of an aspect of the invention, as described hereinbefore, the external connection conductor has a substantially flat top surface. Therefore, in the operation of mounting the plastic molded semiconductor package on the printed board, a margin for positioning can be larger than that in the prior art. Consequently, the plastic molded semiconductor package can be easily mounted on the printed board.

The external connection conductor and the internal connection conductor are formed of different layers. Therefore, the area of the bottom surface of the external connection conductor can be larger than the area of the top surface of the internal connection conductor. As a result, the bottom surface of the external connection conductor can have a portion which is in contact with the surface of the molding resin. This enables substantial increase of the contact area between the molding resin and the electrode for external connection. As a result, it is possible to effectively prevent the delamination of the interfaces between the electrode for external connection and the molding resin. Thus, the plastic molded semiconductor package can have the improved reliability.

Owing to the fact that the area of the bottom surface of the external connection conductor is larger than the area of the top surface of the internal connection conductor, the positions of the external connection conductors can be maintained substantially at the constant positions in the package even if the position of the semiconductor chip in the molding resin is deviated to some extent. Thereby, the plastic molded semiconductor package can be easily mounted on the printed board.

According to the plastic molded semiconductor package of another aspect of the invention, there are provided the metal columns for heat radiation. Therefore, the plastic molded semiconductor package can have a good heat radiating characteristic. If the metal columns for heat radiation are made of the same material as the electrodes for external connection provided for receiving and sending electric signals, the metal columns for heat radiation and the electrodes for external connection can be formed in the same step. Thereby, the plastic molded semiconductor package having the good heat radiating characteristic can be manufactured without reducing the productivity.

According to the method of manufacturing the plastic molded semiconductor package of still another aspect of the invention, the encapsulation is carried out while holding the metal foil. Since the metal foil and the semiconductor chip are fixed, the position of the semiconductor chip is fixed in the encapsulation step. Therefore, the encapsulation can be surely and stably performed by transfer mold method. Further, it is possible to suppress deviation of the position of the semiconductor chip in the molding resin after the encapsulation. Thereby, the external connection conductors can be easily formed at predetermined positions (i.e., design positions), so that the plastic molded semiconductor package which can be easily mounted on the printed board is obtained.

The external connection conductors are formed by the etching of the metal foil. Therefore, the height of the external connection conductor can be increased by increasing the thickness of the metal foil. Consequently, it is possible to form a large space between the surface of the printed board and the surface of the molding resin of the plastic molded semiconductor package joined on the printed board. This facilitates the cleaning step after joining the plastic molded semiconductor package on the printed board.

Since the external connection conductor is formed by the etching of the metal foil, a mold flash does not remain on the side surface thereof in contrast with the prior art. Therefore, a good fillet (meniscus) made of the joining material is formed on the side surface of the external connection conductor when the plastic molded semiconductor package is joined on the printed board. Therefore, the plastic molded semiconductor package joined on the printed board can have an improved reliability.

Since the external connection conductors are formed by the etching of the metal foil, the heights of the protruded external connection conductors from the surface of the molding resin are substantially constant. Therefore, insufficient joining between the external connection conductors and the electrodes on the printed board can be suppressed when the plastic molded semiconductor package is joined on the printed board.

According to a method of manufacturing the plastic molded semiconductor package of further another aspect of the invention, the insulating sheet is held during the resin encapsulation. The insulating sheet is provided with the penetration bumps, which are joined to the semiconductor chip. Therefore, the semiconductor chip can be fixed during the encapsulating operation. Consequently, the resin encapsulation can be stably and surely carried out, similarly to the case already described.

The penetration bumps can be formed in advance in the insulating sheet in a step different from the steps for forming the plastic molded semiconductor package itself. Therefore, the productivity can be improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a plastic molded semiconductor package, which method comprises:

preparing an insulating sheet provided with a penetration bump having ends, at least one of which is protruded from a surface of said insulating sheet;

joining one end of said penetration bump to a pad electrode formed on a main surface of a semiconductor chip;

encapsulating said semiconductor chip with resin while holding said insulating sheet; and cutting said insulating sheet at a predetermined portion to form an end surface of said insulating sheet which is substantially coplanar with a surface of said molding resin, wherein said penetration bump has a first conductor protruded from a surface of said insulating sheet and a second conductor protruded from a rear surface of said insulating sheet, and said step of preparing said insulating sheet having said penetration bump includes the steps of, forming a conductive layer on said rear surface of said insulating sheet, forming a first mask layer on said conductive layer, said first mask layer including a first opening which has a first opening width and exposes a portion of a surface of said conductive layer, effecting electroplating using said first mask layer as a mask to form a second conductor in said first opening, forming a second mask layer on said surface of said insulating sheet, said second mask layer including a second opening which has a second opening width smaller than said first opening width, etching said insulating sheet using said second mask layer as a mask to expose a portion of said surface of said conductive layer, effecting electroplating using said second mask layer as a mask to form a first conductor in said second opening, and removing said first and second mask layers.

2. The method according to claim 1, wherein said step of cutting said insulating sheet includes the steps of, providing conductor material for external connection on a surface of said penetration bump exposed through said insulating sheet, and effecting heat treatment on said conductor material to melt the same for forming an external connection conductor.

* * * * *